(12) United States Patent
Yu et al.

(10) Patent No.: US 8,634,227 B2
(45) Date of Patent: Jan. 21, 2014

(54) RESISTIVE MEMORY DEVICE HAVING VOLTAGE LEVEL EQUALIZER

(75) Inventors: Hak Soo Yu, Seongnam-si (KR); In Gyu Baek, Seoul (KR); Hong Sun Hwang, Suwon-si (KR); Su A Kim, Seongnam-si (KR); Mu Jin Seo, Pyeongtaek-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 213 days.

(21) Appl. No.: 13/184,795

(22) Filed: Jul. 18, 2011

(65) Prior Publication Data

US 2012/0020142 A1    Jan. 26, 2012

(30) Foreign Application Priority Data

Jul. 23, 2010  (KR) .................. 10-2010-0071617

(51) Int. Cl.
   *G11C 11/00*  (2006.01)
(52) U.S. Cl.
   USPC ........... 365/148; 365/100; 365/145; 365/149; 365/163; 365/171

(58) Field of Classification Search
   USPC .................. 365/100, 145, 148, 149, 163, 171
   See application file for complete search history.

(56) References Cited

U.S. PATENT DOCUMENTS

| | | | |
|---|---|---|---|
| 6,574,132 B2 * | 6/2003 | Esterl et al. .................... | 365/145 |
| 7,486,578 B2 * | 2/2009 | Miyakawa et al. ............ | 365/201 |
| 7,596,014 B2 * | 9/2009 | Kawahara et al. ............ | 365/158 |
| 8,233,309 B2 * | 7/2012 | Fasoli ........................... | 365/148 |

FOREIGN PATENT DOCUMENTS

| | | |
|---|---|---|
| JP | 2007-027755 | 2/2007 |
| KR | 1020020021613 | 3/2002 |
| KR | 1020040006674 | 1/2004 |
| KR | 1020040075147 | 8/2004 |

* cited by examiner

*Primary Examiner* — Vanthu Nguyen
(74) *Attorney, Agent, or Firm* — F. Chau & Associates, LLC

(57) ABSTRACT

Provided is a semiconductor resistive memory device. The resistive memory device includes a plurality of unit cells. A source line and a data input/output line of the unit cells may be selectively connected to have a substantially same voltage level for equalization when the unit cells are in inactive or unselected state. The equalization may decrease current consumption and protect write error, and protect leakage current.

6 Claims, 25 Drawing Sheets

FIG. 5
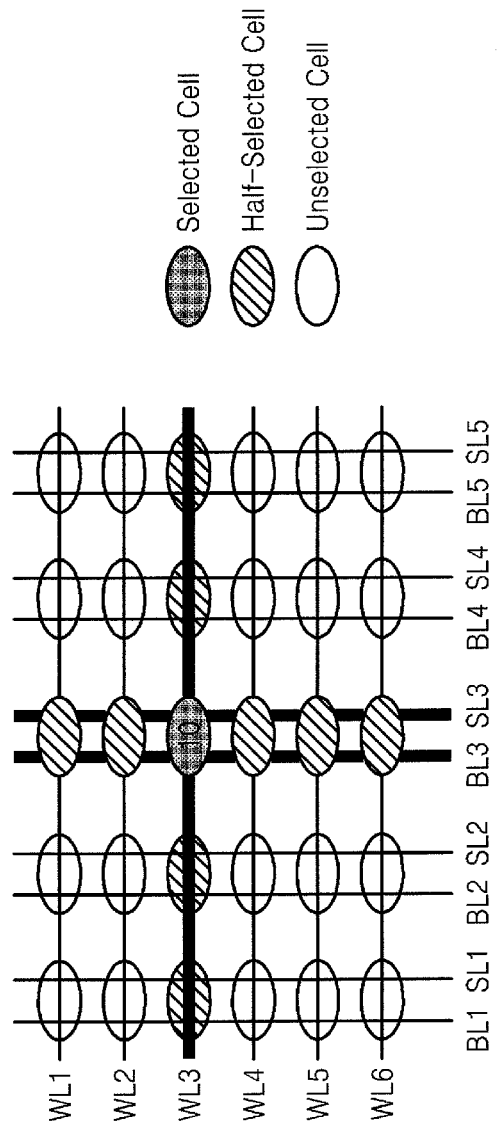
(a)
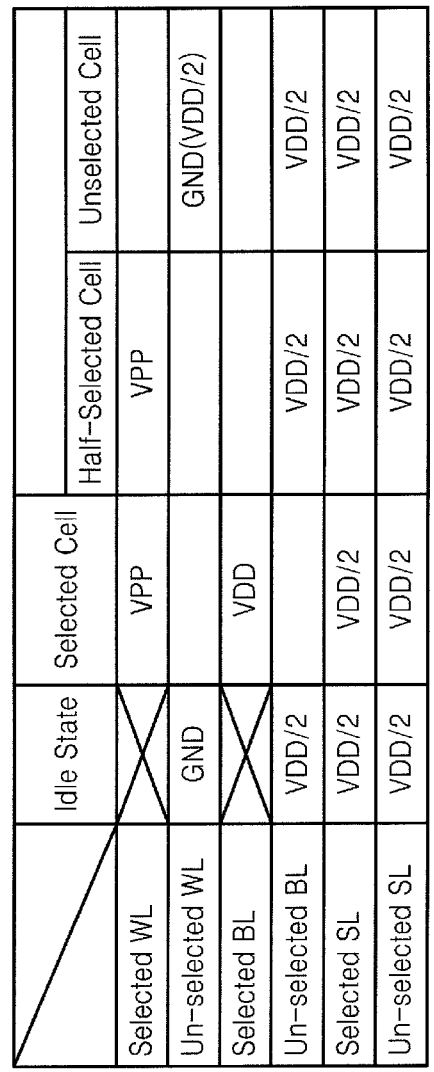
(b)

FIG. 9E

| A | /A | Output | S |
|---|---|---|---|
| L | L | Hi-z | H |
| L | H | L | L |
| H | L | H | L |
| H | H | Hi-z | H |

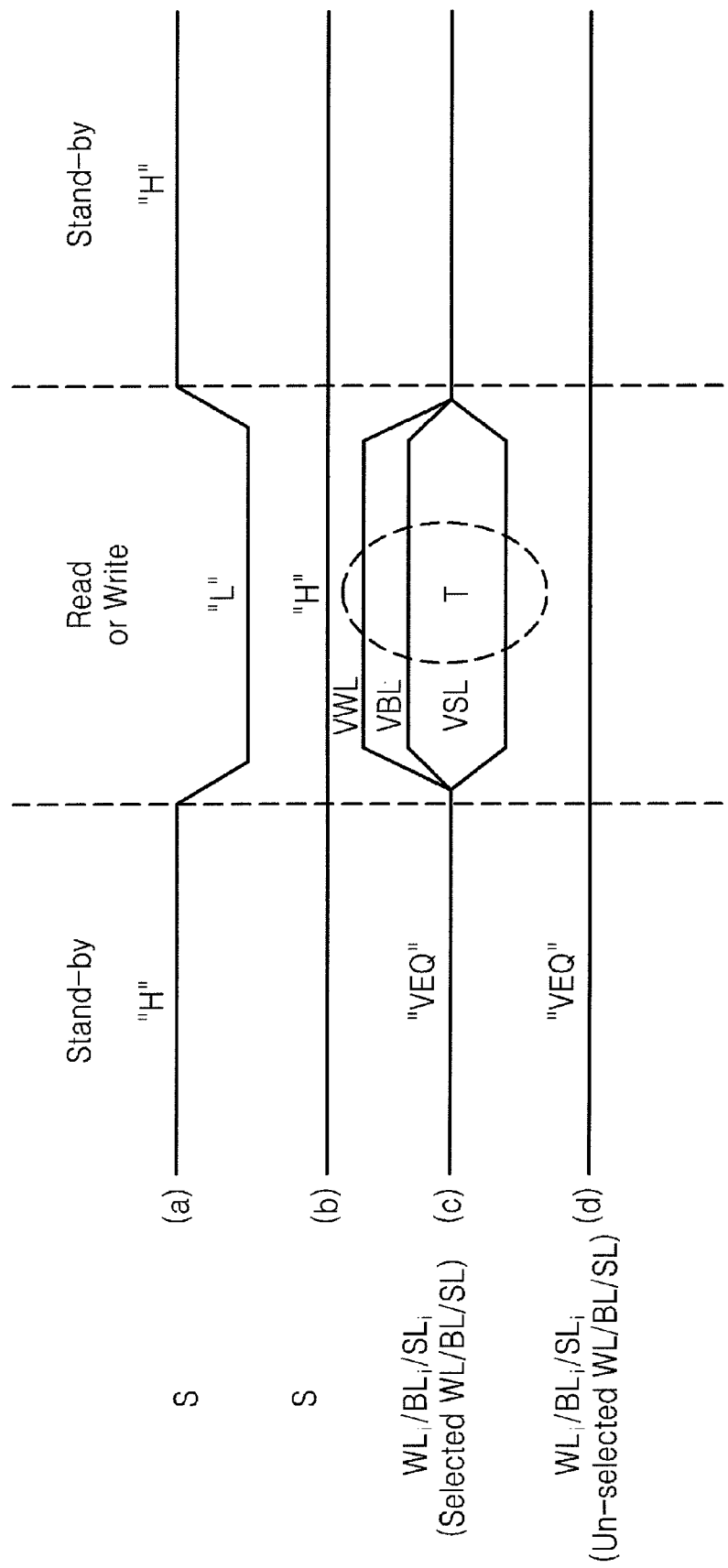

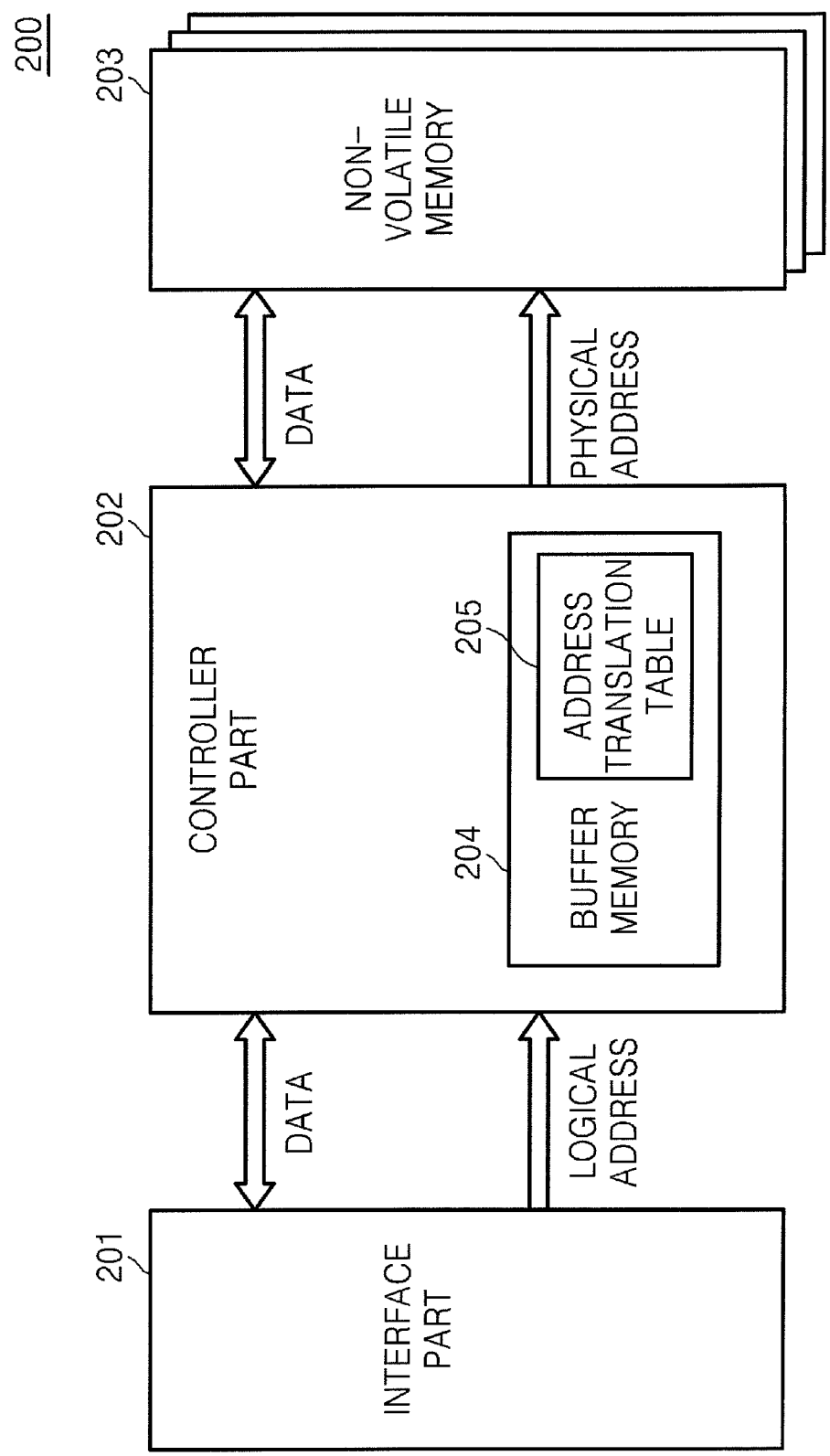

RESISTIVE MEMORY DEVICE HAVING VOLTAGE LEVEL EQUALIZER

CROSS-REFERENCE TO RELATED APPLICATION

This U.S. non-provisional patent application claims priority under 35 U.S.C. §119 to Korean Patent Application No. 10-2010-0071617, filed on Jul. 23, 2010, the entire contents of which is incorporated by reference herein.

BACKGROUND

1. Technical Field

The present disclosure relates to a resistive memory, and more particularly, to a resistive memory including an equalizer.

2. Related Art

A volatile memory includes, for example, a DRAM (Dynamic Random Access Memory), and a non-volatile memory includes, for example, a flash memory. The DRAM is a type of a random access memory that stores a bit of data in a separate capacitor within an integrated circuit. Charges in the capacitor can be leaked. As such, the charges in the capacitor are refreshed periodically. The non-volatile memory can be used as a data storage device. The data can be electrically erased and programmed. A resistive memory is a type of the non-volatile memory. The resistive memory may include MRAM (Magnetic Random Access Memory), PRAM (Phase changeable Random Access Memory), and ReRAM (Resistance Random Access Memory).

SUMMARY

According to an embodiment, a resistive memory device comprises a memory cell including a resistive element for storing data and a switching element, the switching element including at least three terminals, a first terminal of the three terminals is coupled to the resistive element, a control line coupled to a second terminal of the three terminals to control the switching element, a data input/output line coupled to the resistive element to read data from the resistive element or write data to the resistive element, a source line coupled to a third terminal of the three terminals, and an equalizer configured to selectively connect the data input/output line and the source line.

The equalizer may connect the data input/output line and the source line to have a substantially same voltage level when the memory cell is in inactive state.

The equalizer may connect the data input/output line and the source line to have a substantially same voltage level without an external power supply.

The equalizer may be configured to selectively connect the data input/output line, the source line and the control line to have a substantially same voltage level when the memory cell is in inactive state.

The resistive memory may further comprise at least one of a first sub-equalizer configured to selectively connect the data input/output line and the control line and a second sub-equalizer configured to selectively connect the source line and the control line.

The resistive memory may further comprise a clamper configured to clamp a voltage of the data input/output line and the source line.

The resistive memory may further comprise a decoder to control at least one of the control line, data input/output line, and the source line.

The decoder may comprise the equalizer therein.

According to an embodiment, a three-dimensional resistive memory device comprises a multi-stack layer including a plurality of stacked layers, at least one of the stacked layers comprising a memory cell including a resistive element and a switching element, the switching element including at least three terminals, a first terminal of the three terminals is coupled to the resistive element, a control line coupled to a second terminal of the three terminals to control the switching element, a data input/output line coupled to the resistive element to read data from the resistive element or write data to the resistive element, and a source line coupled to a third terminal of the three terminals, and an equalizer configured to selectively connect the data input/output line and the source line.

The equalizer may be disposed on at least one layer of the stacked layers.

The equalizer may be disposed on different layer of the stacked layers.

The equalizer may connect the data input/output line and the source line to have a substantially same voltage level when the memory cell is in inactive state.

The equalizer may connect the data input/output line and the source line to have a substantially same voltage level without an external power supply.

The equalizer may connect the data input/output line, the source line and the control line to have a substantially same voltage level when the memory cell is in inactive state.

The three-dimensional resistive memory device further may comprise at least one of a first sub-equalizer configured to selectively connect the data input/output line and the control line and a second sub-equalizer configured to selectively connect the source line and the control line.

The three-dimensional resistive memory device further may comprise a clamper configured to clamp a voltage of the data input/output line and the source line.

The three-dimensional resistive memory device further may comprise a decoder to control at least one of the control line, data input/output line, and the source line.

The decoder may comprise the equalizer therein.

According to an embodiment, a resistive memory device comprises a memory cell including a resistive element, a data input/output line coupled to a first end of the resistive element to read data from the resistive element or write data to the resistive element, a control line coupled to a second end of the resistive element to access the resistive element, and an equalizer configured to selectively connect the data input/output line and the control line for equalizing the data input/output line and the control line to have a substantially same voltage level when the memory cell is in inactive state.

The resistive memory may further comprise a clamper configured to clamp a voltage of the data input/output line and the control line.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIG. 5(a) is a schematic diagram illustrating an equalization of a resistive memory cell array according to an embodiment of the inventive concept;

FIG. 5(b) is a table illustrating an equalization of a resistive memory cell array according to an embodiment of the inventive concept;

FIGS. 9a to 9f are circuit diagrams and a table illustrating a decoder according to embodiments of the inventive concept;

FIG. 10 is a timing diagram illustrating an equalizing operation of a semiconductor device according to an embodiment of the inventive concept;

FIG. 20 is a block diagram illustrating memory card including a semiconductor memory device according to an embodiment of the inventive concept.

DETAILED DESCRIPTION OF THE EMBODIMENTS

Figure 1:
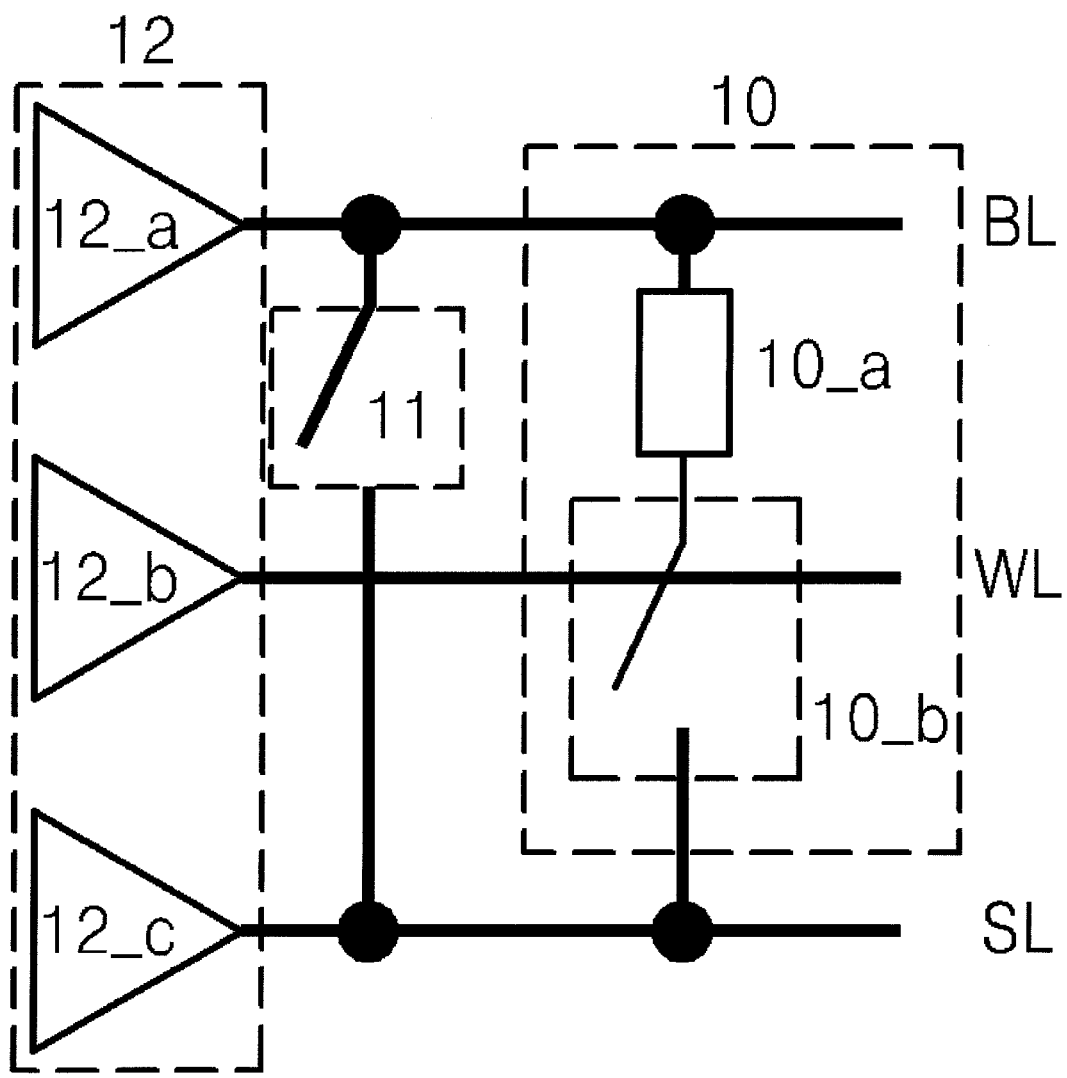
FIG. 1 is a schematic diagram illustrating a resistive memory according to an embodiment of the inventive concept.

Exemplary embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

In the drawings, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present.

Hereinafter, exemplary embodiments of the inventive concept will be described in detail with reference to the accompanying drawings.

FIG. 1 is a schematic diagram illustrating a resistive memory according to an embodiment of the inventive concept.

Referring to FIG. 1, a memory cell 10 includes a resistive element 10_a and a switching element 10_b. The switching element 10_b may include at least three-terminals. A first terminal of the three-terminals is coupled to the resistive element 10_a. A control line WL controls turning on or off of the switching element 10_b. The control line WL controls the iteration of data between the resistive element 10_a of the memory cell 10 and outside. The iteration refers to an access operation for reading or writing data. The control line WL is connected to a second terminal of the switching element 10_b. For instance, the second terminal can be a gate electrode of a CMOS transistor.

A data input/output line BL supplies a voltage pulse like a VDD or GND (i.e. VSS) for the memory cell 10 to transmit data from the memory cell 10 to outside in read operation. The data input/output line BL supplies a voltage pulse to change the resistance of the resistive element 10_a in write operation. A first end of the resistive element 10_a may be coupled to the switching element 10_b. A second end of the resistive element 10_a may be coupled to the data input/output line BL. The source line SL may be connected to the third terminal of the switching element 10_b. For instance, the third terminal can be a source/drain of CMOS transistor. The source line SL maintains a different voltage from the data input/output line BL in read or write operation. The source line SL supplies a reference voltage for reading data from or writing data into the memory cell 10.

The memory cell 10 may have various structures according to the switching element (i.e. access element) 10_b. For instance, the switching element 10_b may include a transistor. The transistor may have three terminals (i.e., gate, source and drain). The transistor may include N/P-type MOSFETs (Metal Oxide Semiconductor Field Effect Transistors), JFETs (Junction Field Effect Transistors) and BJTs (Bipolar Junction Transistors). The resistive element 10_a and switching element 10_b may switch positions with respect to each other. For example, the switching element 10_b may be coupled to the data input/output line BL and the resistive element 10_a may be coupled to the source line SL.

According to an embodiment, the switching element 10_b may include two terminals. In an embodiment, a diode can be the switching element 10_b. In an embodiment, the switching element 10_b may be formed with one or more diodes. When the switching element 10_b includes two-terminal switching element 10_b, the switching element 10_b may be coupled to the resistive element 10_a and the control line WL or the data input/output line BL. The source line SL may be omitted when the switching element 10_b includes two terminals.

A driver 12 may include a data input/output line driver 12_a, a control line driver 12_b and a source line driver 12_c. The data input/output line driver 12_a drives the data input/output line BL. The control line driver 12_b drives the control line WL. The source line driver 12_c drives the source line SL.

An equalizer 11 may enable the source line SL to have a substantially equal voltage level with the data input/output line BL coupled to the same memory cell 10. The equalizer 11 may be inactivated for normal read or write operation. The equalizer 11 may be activated when the memory cell is in standby state or unselected. For instance, when the equalizer 11 comprises a switch, the switch may be open in an active mode of the memory cell 10. The switch may be closed when the memory cell 10 is in a standby mode. The control line WL may maintain a ground voltage level (VSS or GND) or a floating state such that the control line WL may control the switching element 10_b to be an open state. The physical connection between the source line SL and the data input/output line BL may cause a charge sharing between the source line SL and the data input/output line BL. The charge sharing refers to sharing of charges when two or more lines or circuitries having different voltages are coupled for the equilibrium of the charges. The different voltages refer to a situation that the two or more lines or circuitries have different charges.

The source line SL and the data input/output line BL may have a same voltage level through the charge sharing without an external power supply. The charge sharing may reuse charges used to maintain respective voltage levels for the source line SL and the data input/output line BL prior to the equalizing. The source line SL and the data input/output line BL may maintain a constant voltage level in an inactive state of the memory cell 10 such that a leakage current of the memory cell 10 may be blocked. The charge reuse using the equalizer 11 may prevent a data error in write operation and a leakage current. When the charges are remained at the source line SL or the data input/output line BL after the iteration, the source line SL and the data input/output line BL may be unstable. An operation of adjacent memory cells may affect other memory cells in an inactive state such that data error and leakage current may occur.

When the equalizer 11 comprises the switch, each memory cell 10 may selectively share the switch. A memory array, including the memory cell 10, may include the equalizer 11. The driver 12 may have an equalizing function therein such that the equalizing function may be performed without additional equalizing circuits. The equalizing refers to a situation that the source line SL and the data input/output line BL have a same voltage level by controlling the equalizer 11 (e.g. turning on the switch of the equalizer 11).

Figure 2:
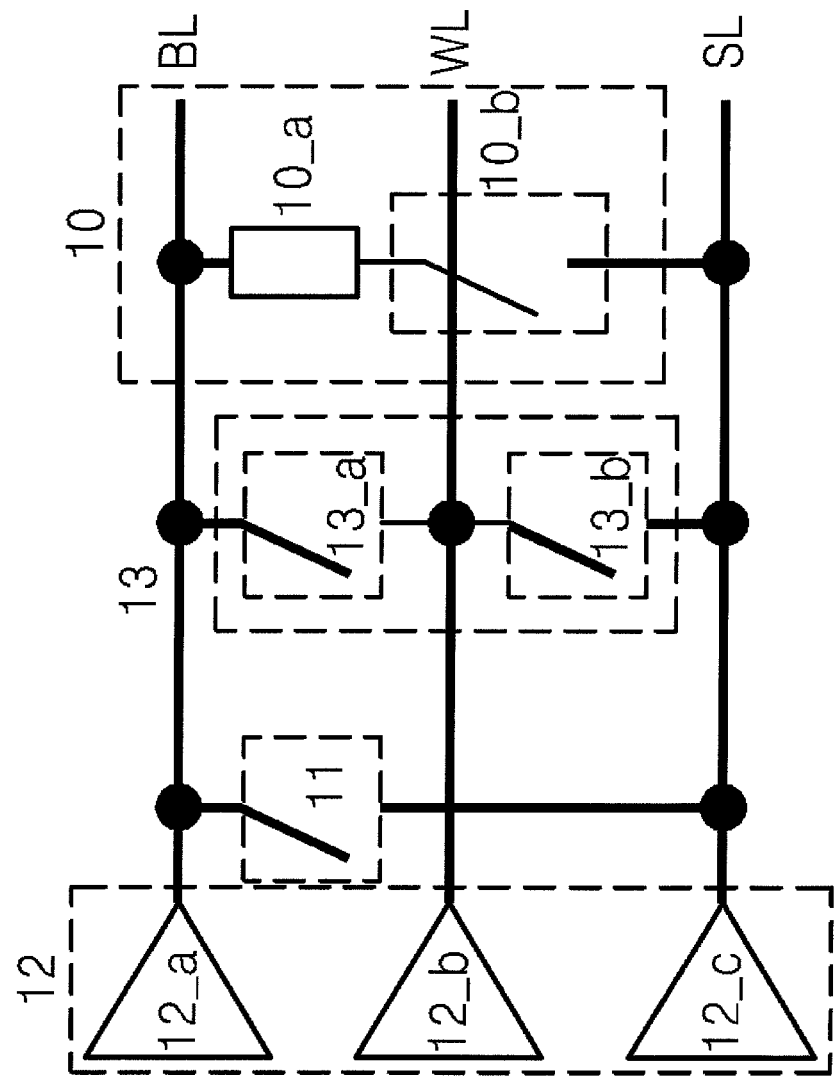
FIG. 2 is a schematic diagram illustrating a resistive memory according to an embodiment of the inventive concept.

FIG. 2 is a schematic diagram illustrating a resistive memory according to an embodiment of the inventive concept.

Referring to FIG. 2, a sub-equalizer 13 is described. The sub-equalizer 13 selectively connects the control line WL to have a same voltage level with the data input/output line BL and the source line SL in standby or inactive state of the memory cell 10. The sub-equalizer 13 may include a first sub-equalizer 13_a and a second sub-equalizer 13_b. The first sub-equalizer 13_a may be disposed between the data input/output line BL and the control line WL. The second sub-equalizer 13_b may be disposed between the control line WL and the source line SL. The first sub-equalizer 13_a may electrically connect the data input/output line BL and the control line WL for equalizing through the charge sharing. The second sub-equalizer 13_b may electrically connect the control line WL and the source line SL for equalizing through the charge sharing.

There may be various equalizing methods between the source SL and the data input/output line BL in standby state of the memory cell 10. One of the equalizing methods is fixing the control line WL with a ground voltage (i.e. VSS) level. Another equalizing method is floating the control line WL. Another equalizing method is to electrically connect the control line WL with the data input/output line BL and the source line SL such that the three lines substantially have a same voltage level.

The sub-equalizer 13 may include at least one of the two sub-equalizers 13_a, 13_b. The equalizer 11 may include the sub-equalizer 13 therein according to an embodiment. The driver 12 may have an equalizing function that can control the electrical connection among the data input/output line BL, the control line WL and the source line SL.

Referring to FIGS. 1 and 2, the memory cell 10 is coupled to the equalizer 11 and/or sub-equalizer 13. A memory cell array according to an embodiment may include a plurality of the memory cells 10. The equalizer 11 and/sub-equalizer 13 may be commonly coupled to the memory cells 10 constituting the memory cell array. Herein, 'commonly coupled' refers to a situation that one equalizer 11 and/or one sub-equalizer 13 is coupled to a plurality of memory cells.

The switching element 10_b may have a plurality of terminals. When the memory cell 10 includes a two-terminal switching element 10_b such as diode, the source line SL may be omitted. The equalizer 11 and the sub-equalizer 13 may control the selective electrical connection for equalizing between the data input/output line BL and the control line WL in the memory cell 10, including two-terminal switching element 10_b. The driver 12 may have a high impedance value of the outputs generated during an equalizing state. The memory cell 10 including two-terminal switching element 10-b may electrically connect substantial all memory cells in a standby mode.

Figure 3:
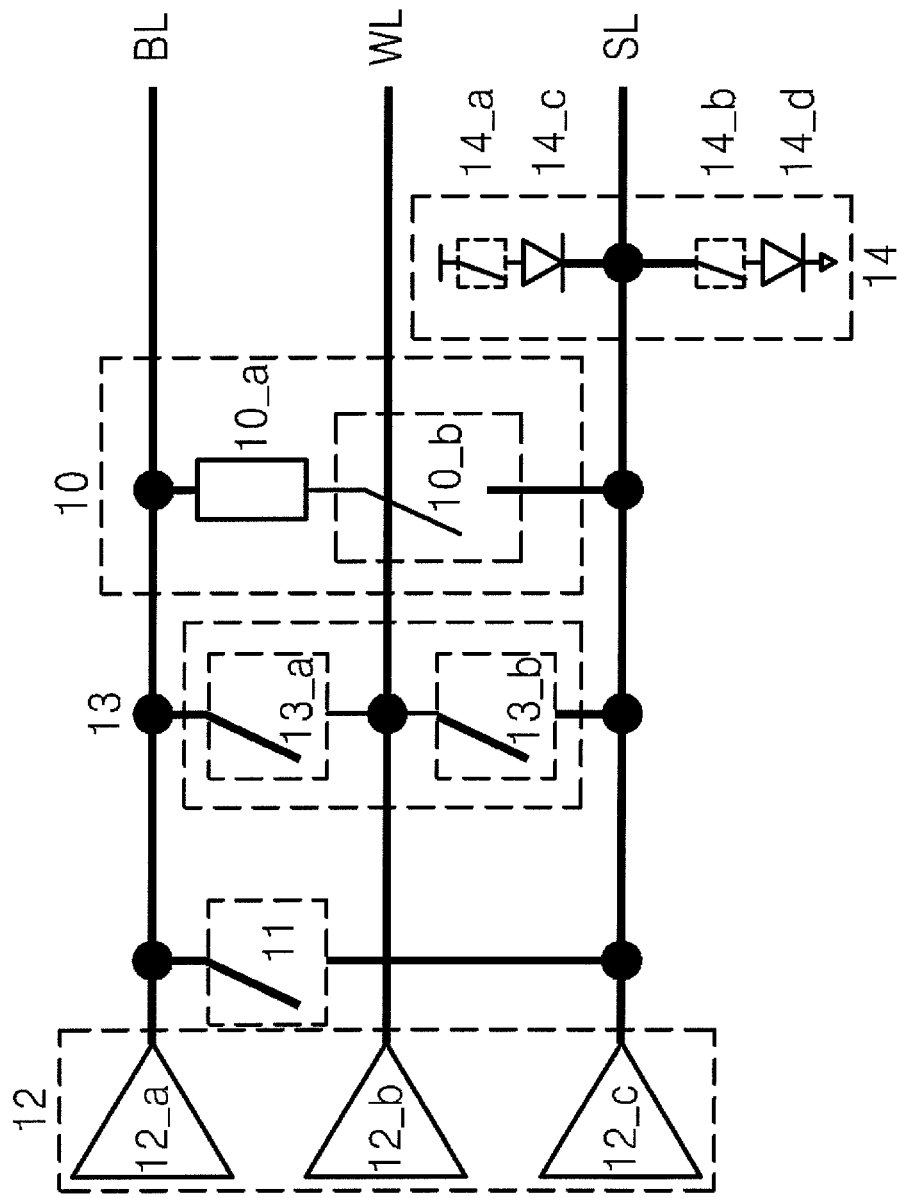
FIG. 3 is a schematic diagram illustrating a resistive memory according to an embodiment of the inventive concept.

FIG. 3 is a schematic diagram illustrating a resistive memory according to an embodiment of the inventive concept.

FIG. 3 may include a clamper 14. Referring to FIGS. 1, 2 and 3, the source line SL and the data input/output line BL and/or the control line WL may have a same voltage level by connecting each other using the equalizer 11 and the sub-equalizer 13 in standby operation of the memory cell 10.

A resistive memory device including the memory cell 10 may be applicable to various systems like a computer system. Each system may have an appropriate equalizing voltage level. The 'appropriate equalizing voltage level' refers to an optimum voltage level for the operation of a system. The different equalizing voltage level may be caused by a frequency (e.g. clock frequency) and an operation supply voltage according to the system. A user can set the equalizing voltage level prior to or during the operation.

The clamper 14 may set the equalizing voltage level using, for example, an external supply voltage. The clamper 14 can be connected between a voltage source (e.g., external power voltage) and the source line SL. The voltage source may include a ground voltage (GND or VSS) and a power supply voltage (VDD). The clamper 14 can be connected between a voltage source (e.g., external power voltage) and the control line WL or the data input/output line BL.

The clamper 14 may be commonly coupled to the memory cells included in the memory cell array. Herein, 'commonly coupled' refers to that one clamper may be coupled to a plurality of memory cells. The driver 12 may include a clamping function. The equalizer 11 may include a clamping function. Also, the equalizer 11 may comprise the sub-equalizer 13 and/or the clamper 14 therein.

The clamper 14 may include a switch 14_a and a diode 14_c serially connected between a voltage source (e.g., power supply voltage) and the source line SL. The clamper 14 may include a switch 14_b and a diode 14_d serially connected between the source line SL and a voltage source (e.g., ground voltage). The clamper 14 may further include a voltage divider. When performing the clamping operation, the voltage divider may supply the source line SL or the data input/output line BL as a clamping voltage level by dividing an external voltage.

Figure 4:
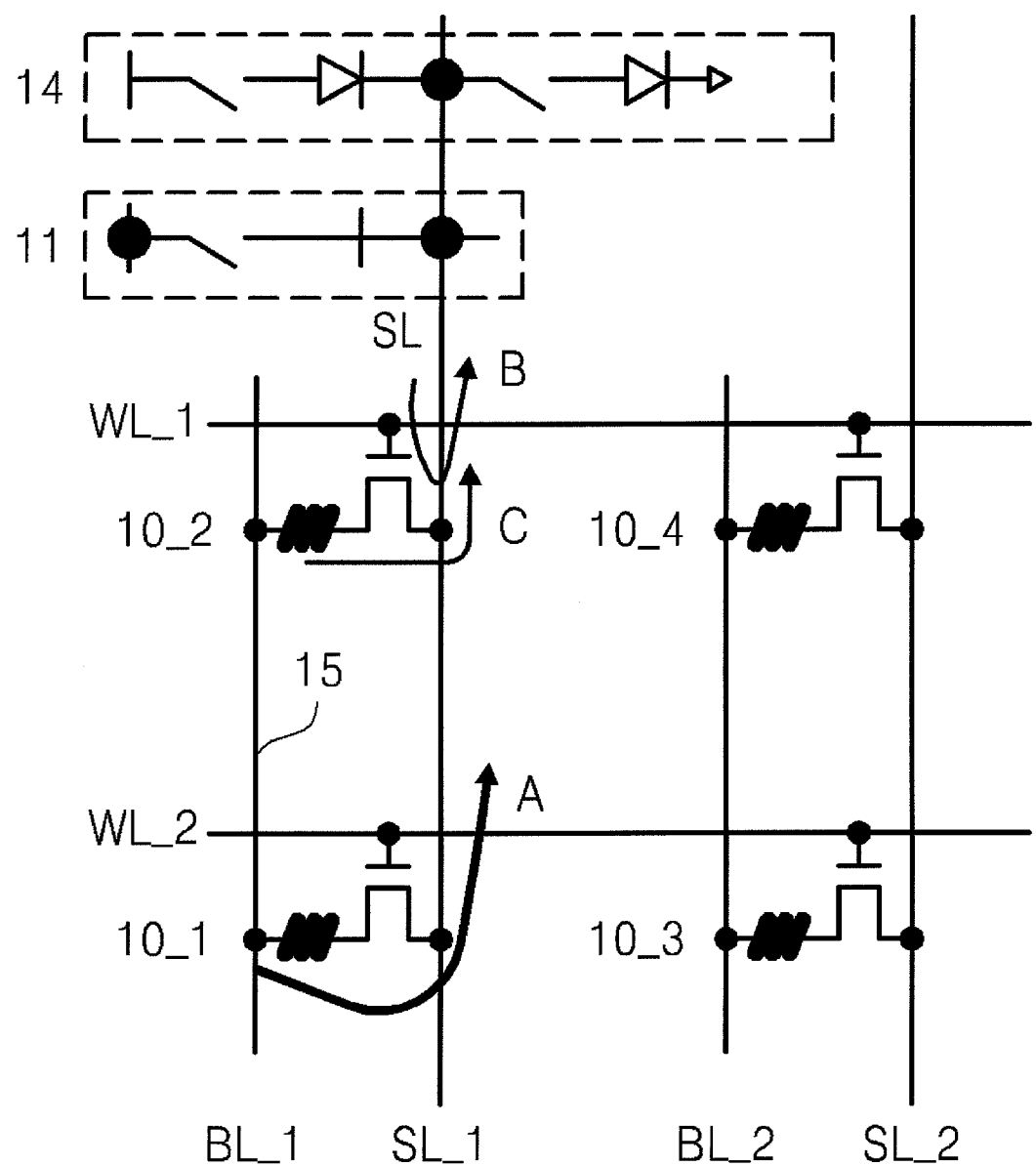
FIG. 4 is a schematic diagram illustrating an operation of a resistive memory cell array according to an embodiment of the inventive concept.

FIG. 4 is a schematic diagram illustrating an operation of a resistive memory cell array according to an embodiment of the inventive concept.

Referring to FIG. 4, the resistive memory cell array includes unit cells 10_1~10_4. The unit cells 10_1~10_4 may respectively include a resistive element and a switching element. The unit cell 10_2 and the unit cell 10_4 are commonly connected to a control line WL_1. The unit cell 10_1 and the unit cell 10_3 are commonly connected to a control line WL_2. The unit cell 10_1 and the unit cell 10_2 are commonly connected to a data input/output line BL_1 and a source line SL_1. The unit cell 10_1 and the unit cell 10_2 are commonly connected to the equalizer 11 and the clamper 14. The unit cell 10_3 and the unit cell 10_4 are commonly connected to a data input/output line BL_2 and a source line SL_2.

The unit cell 10_1 and the unit cell 10_2 are commonly connected to the source line SL_1 and the data input/output line BL_1 such that the source line SL_1 and the data input/output line BL_1 may have a same voltage level during idle state or standby state of the memory device. The source line SL_1 and the data input/output line BL_1 may have a same voltage level when one of the unit cell 10_3 and unit cell 10_4 commonly connected to the data input/output line BL_2 and the source line SL_2 is in an active state.

The equalizer 11 and the clamper 14 can be commonly connected to the unit cells 10_1~10_4. When the unit cells 10_1~10_4 are commonly connected to the equalizer 11 and the clamper 14, each source line SL_1, SL_2 and data input/output line BL_1, BL_2 may maintain a floating state. When the memory cells 10_1~10_4 are in the standby state or idle state, the source lines SL_1, SL_2 and the data input/output lines BL_1, BL_2 may be electrically connected and have a same voltage level in common (i.e. equalized).

FIG. 5(a) is a schematic diagram illustrating an equalization (or, an equalizing) of a resistive memory cell array according to an embodiment of the inventive concept.

Referring to FIG. 5(a), unit cells are arranged in a matrix and each unit cell is commonly connected to respective control lines WL1~WL6 in a row direction. Each unit cell is commonly connected to respective data input/output lines BL1~BL5 and source lines SL1~SL5 in a column direction.

The unit cell 10 in FIG. 5(a) can be a selected unit cell for read or write operation. Unit cells represent with circles having slashed lines represent half-selected. The 'half-selected' refers to a situation that one of the lines is selected among the source lines SL1~SL5, the data input/output lines BL1~BL5 and the control lines WL1~WL5. Unit cells represent with circles having un-slashed lines therein represent unselected. The 'unselected' refers to a situation that none of the lines is selected among the source lines SL1~SL5, the data input/output lines BL1~BL5 and the control lines WL1~WL5.

Each unit cell may be connected to a respective equalizer. Two or more unit cells may be commonly connected to an equalizer.

FIG. 5(b) is a table illustrating an equalization of a resistive memory cell array according to an embodiment of the inventive concept.

Referring to FIG. 5(b), an operating voltage variation of the respective signal line according to the equalization is described. When memory cell array is in an idle state, each source line SL1~SL5 and each data input/output line BL1~BL5 may have a same voltage level by an electrical connection for the equalization.

For instance, a source line may have a ground voltage level according to the prior read or write operation. A data input/output line may have a power supply voltage level according to the same prior operation. When the source line and the data input/output line are electrically connected, a half-VDD (VDD/2) voltage level may be obtained by the equalization on the source line and the data input/output line. The clamper 14 may change the equalizing voltage level variously.

According to an embodiment, when the unit cell 10 (in FIG. 4) is selected for an operation, a high voltage level VPP is applied to the control line WL3. A data input/output line BL3 may have a VDD voltage level and a source line SL3 may have a VDD/2 voltage level. Unit cells sharing the control line WL3 in a row direction with the unit cell 10 may maintain a VPP voltage level on the control line WL3. Unit cells sharing the source line SL3 and the data input/output line BL3 in a column direction with the unit cell 10 may maintain a floating or ground voltage level on the control lines WL1, WL2, WL4, WL5 and WL6.

The source lines SL1, SL2, SL4, SL5 and the data input/output lines BL1, BL2, BL4, BL5 coupled to the unselected cells may maintain a voltage level. The voltage level may be defined by equalizing or both equalizing and clamping. The control lines WL1, WL2, WL4, WL5 coupled to the unselected unit cells may be floated.

When a switching element of the unit cell comprises an NMOS transistor, the control line WL1~WL6 may have a ground voltage level to turn off the NMOS transistor. In equalization, the control lines WL1, WL2, WL4, WL5, WL6 may have a same voltage level with the source lines SL1, SL2, SL4, SL5 and the data input/output lines BL1, BL2, BL4, BL5.

Figure 6:
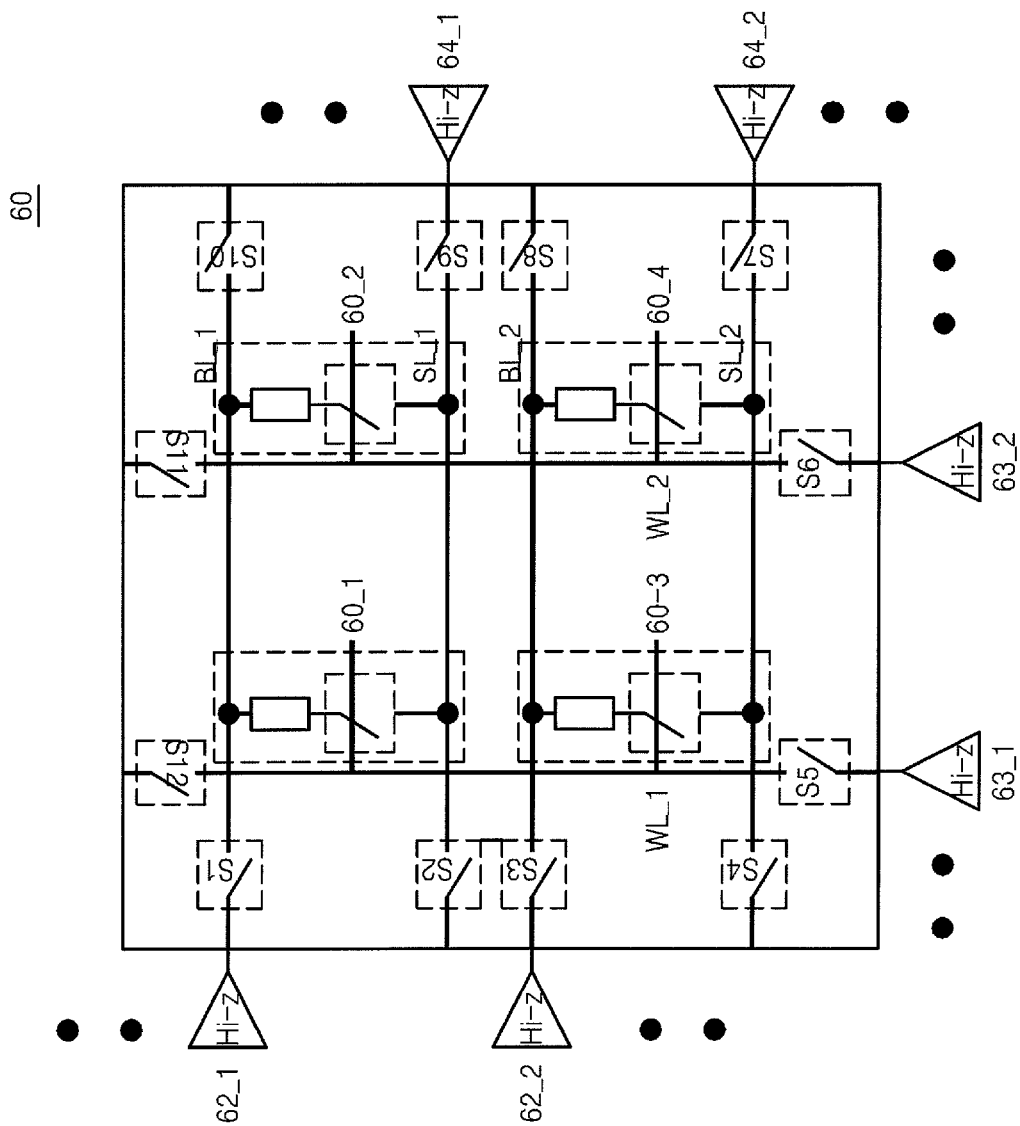
FIG. 6 is a schematic circuit diagram illustrating a resistive memory according to an embodiment of the inventive concept.

FIG. 6 is a schematic circuit diagram illustrating a resistive memory according to an embodiment of the inventive concept.

Referring to FIG. 6, the resistive memory 60 includes unit cells 60_1~60_4, control lines WL_1, WL_2, data input/output lines BL_1, BL_2 and source lines SL_1, SL_2, switches S1-S12, and decoders 62_1~64_2.

The data input/output line BL_1 is connected to respective resistive elements of the unit cells 60_1, 60_2. The source line SL_1 is connected to switching elements of the unit cells 60_1, 60_2. The control line WL_1 is connected to switching elements of the unit cells 60_1, 60_3. The data input/output line BL_2 is connected to respective resistive elements of the unit cells 60_3, 60_4. The source line SL_2 is connected to switching elements of the unit cells 60_3, 60_4. The control line WL_2 is connected to switching elements of the unit cells 60_2, 60_4. Each driver 42_1~44_2 may drive corresponding lines BL_1, BL_2, SL_1, SL_2, WL_1, WL_2.

Switches S1, S10 may selectively connect the data input/output line decoder 62_1 and the data input/output line BL_1. Switches S2, S9 may selectively connect the source line decoder 64_1 and the source line SL_1. Switches S5, S12 may selectively connect the control line decoder 63_1 and the control line WL_1. Switches S3, S8 may selectively connect the data input/output line decoder 62_2 and the data input/output line BL_2. Switches S4, S7 may selectively connect the source line decoder 64_2 and the source line SL_2. Switches S6, S11 may selectively connect the control line decoder 63_2 and the control line WL_2. Switches S1~S12 may constitute an equalizer. The equalizer may selectively connect the lines to have the same voltage level when corresponding unit cells 60_1~60_4 are in standby (idle) state or un-selected.

When the switches S1, S2, S3, S4, S7, S8, S9, S10 are on, the source line SL_1, SL_2 may have the same voltage level with the data input/output lines BL_1, BL_2 according to the equalization. The switches S5, S6, S11, S12 may be off. Then, output terminals of decoder 42_1~44_2 may be in a high-impedance state.

When switches S1~S12 are turned on in a standby state, the source lines SL_1, SL_2, the data input/output lines BL_1, BL_2 and the control lines WL_1, WL_2 may be electrically connected and have a same voltage level by the equalization.

Switches S1~S12 in FIG. 6 are formed separately with each other. Switches S1~S12 can be merged to one or more switches. That is, the resistive memory 60 may have at least one switch. Furthermore, each signal line driver 42_1~44_2 can include the equalizing and/or clamping function.

Figure 7:
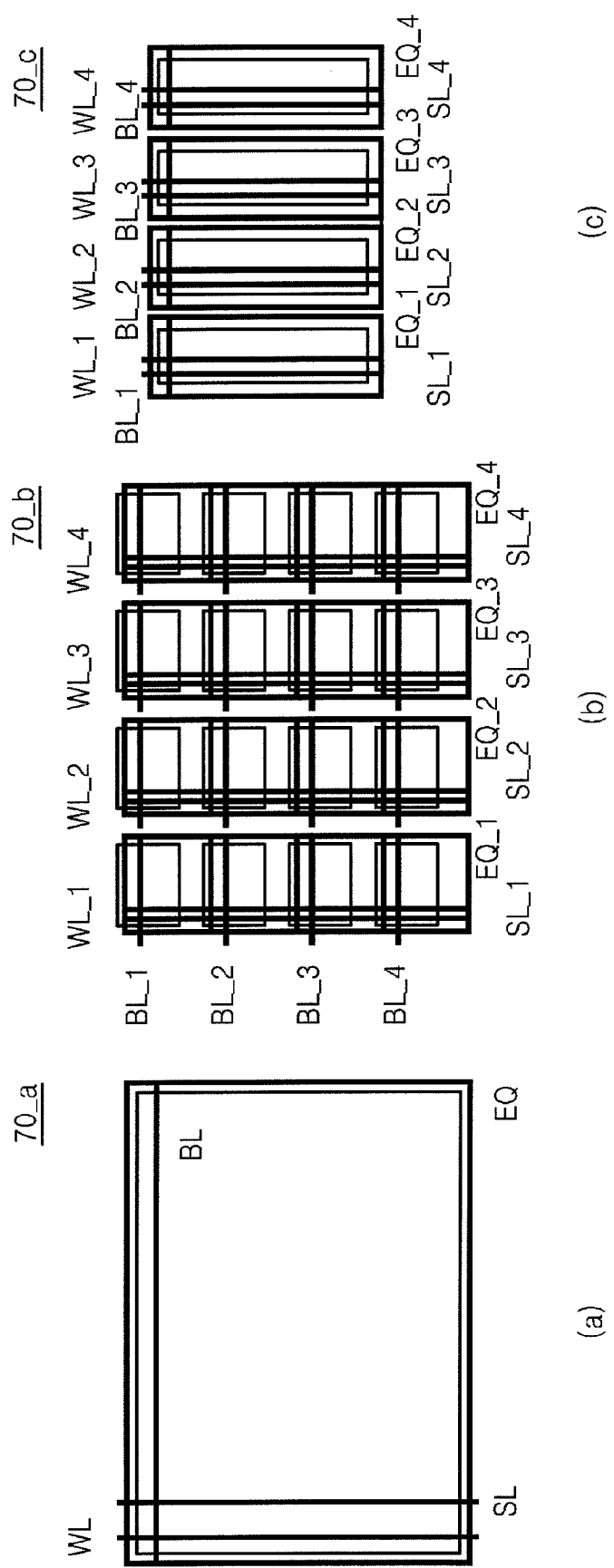
FIGS. 7(a),(b),(c) are schematic diagrams illustrating various equalizing paths according to embodiments of the inventive concept.

FIG. 7 is a schematic diagram illustrating various equalizing paths according to an embodiment of the inventive concept.

FIG. 7 (a) schematically illustrates a control line WL, a source line SL and a data input/output line BL. An equalizing path EQ may be connected to the control line WL, the data input/output line BL and source line SL throughout the memory cell array 70_a. Sharing of the equalizing path EQ refers to a situation that control line WL, data input/output line and source line SL may have a same voltage level due to the electrical connection for equalization in standby or idle state of the memory cell array 70_a.

FIGS. 7 (b) and (c) illustrate an embodiment of selectively grouped equalizing paths EQ_1~EQ_4 of the memory cells.

Referring to FIG. 7 (b), 4 by 4 cell blocks are arranged in matrix. Cell blocks arranged in the same column may have an equalizing path EQ_1. Unit cells constituting the cell blocks may have the same equalizing path EQ_1. When cell blocks having equalizing path EQ_1 are in a standby (e.g. idle) mode, a control line WL_1, a data input/output line BL_1 and a source line SL_1 may be electrically connected for equalizing. Cell blocks respectively having equalizing paths EQ_2~EQ_4 may have a similar or the same configuration and an operation such as the cell blocks having equalizing path EQ_1. Each cell block may include at least one unit cell.

Each cell block may perform an operation independently in the same memory cell array 70_b. For instance, when cell block having equalizing paths EQ_1 is in an active state for read or write operation, cell blocks respectively having equalizing paths EQ_2~EQ_4 may be in a standby state. Unit cells constituting cell blocks respectively having equalizing paths EQ_2~EQ_4 may have the same voltage level by electrical connection for equalizing.

When equalizing a cell block, each control line WL_1~WL_4 may be selectively equalized or in a floating state (e.g., having an un-defined voltage level). When a switching element of the unit cell includes an NMOS transistor, each control line WL_1~WL_4 may have a ground voltage level.

Referring to FIG. 7 (c), a memory cell array 70_c includes 4 cell blocks. Each cell block may perform an operation independently. Each cell block may have independent equalizing paths EQ_1~EQ_4. Each cell block may be similar to a column of cell blocks in FIG. 7 (b).

Figure 8:
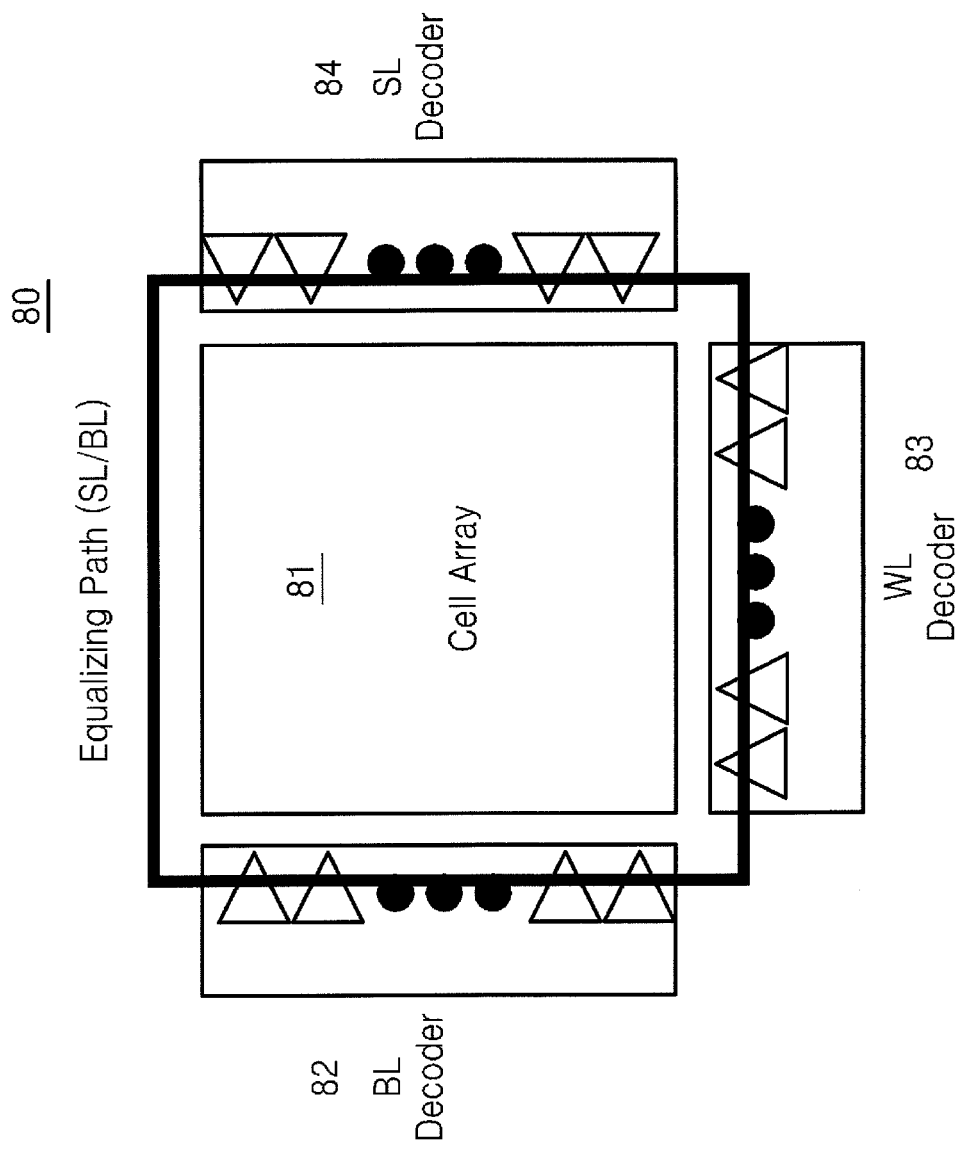
FIG. 8 is a schematic block diagram illustrating a semiconductor memory device according to an embodiment of the inventive concept.

FIG. 8 is a schematic block diagram illustrating a semiconductor memory device according to an embodiment of the inventive concept.

Referring to FIG. 8, the semiconductor memory device 80 includes memory cell array 81, bit line decoder 82, word line decoder 83 and source line decoder 84. The memory cell array 81 may include a plurality of unit cells arranged in a matrix including resistive element and a switching element. The bit line decoder 82 controls the bit line BL. The word line decoder 83 controls the word line WL. The source line decoder 84 controls the source line SL. Each decoder 82, 83, 84 may select a designated signal lines that is WL, BL and SL by decoding operation according to a corresponding address and control signal.

An equalizer may comprise extra switches. Decoders 82, 83, 84 may be configured to have the equalizing function therein.

FIG. 9a to FIG. 9f are circuit diagrams and a table illustrating a decoder according to an embodiment of the inventive concept.

FIG. 10 is a timing diagram illustrating an equalizing operation of a semiconductor device according to an embodiment of the inventive concept.

Figure 9A:
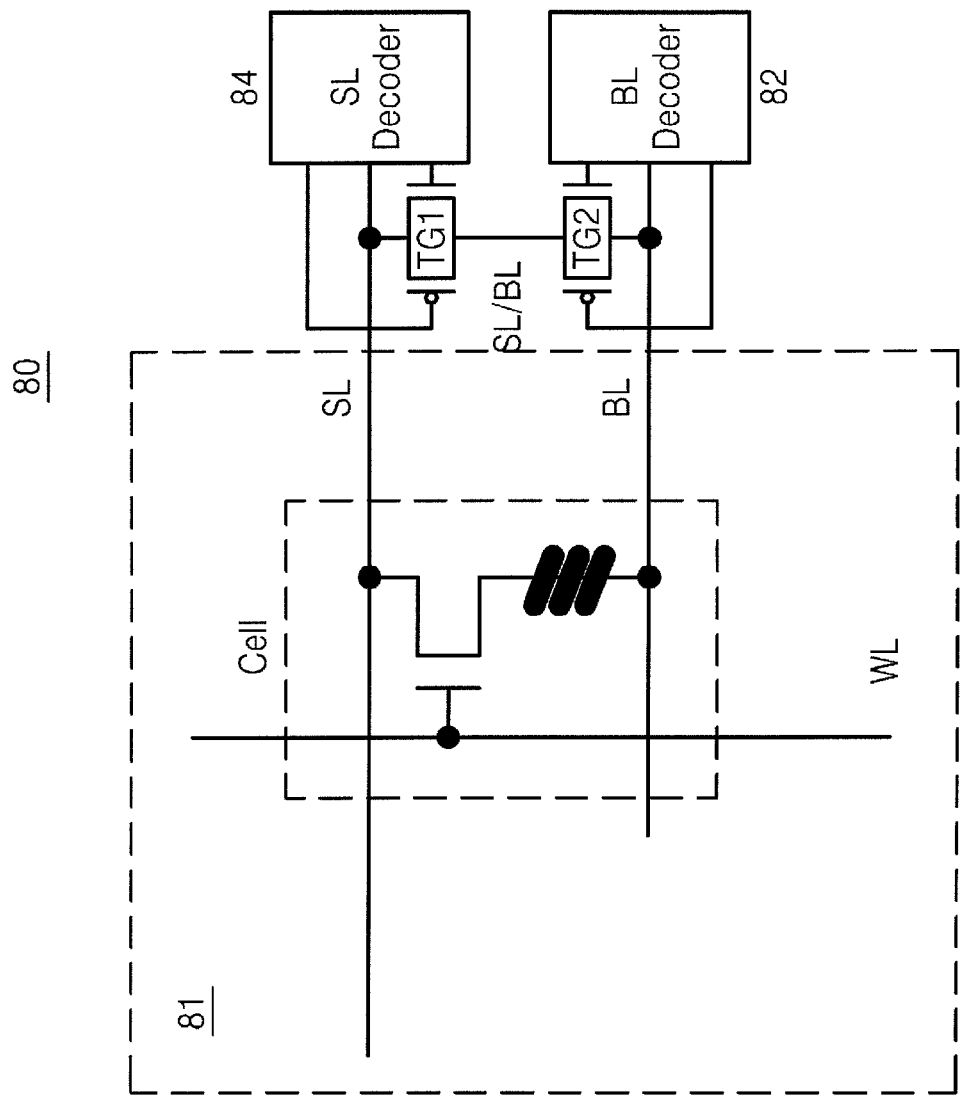
Figure 11:
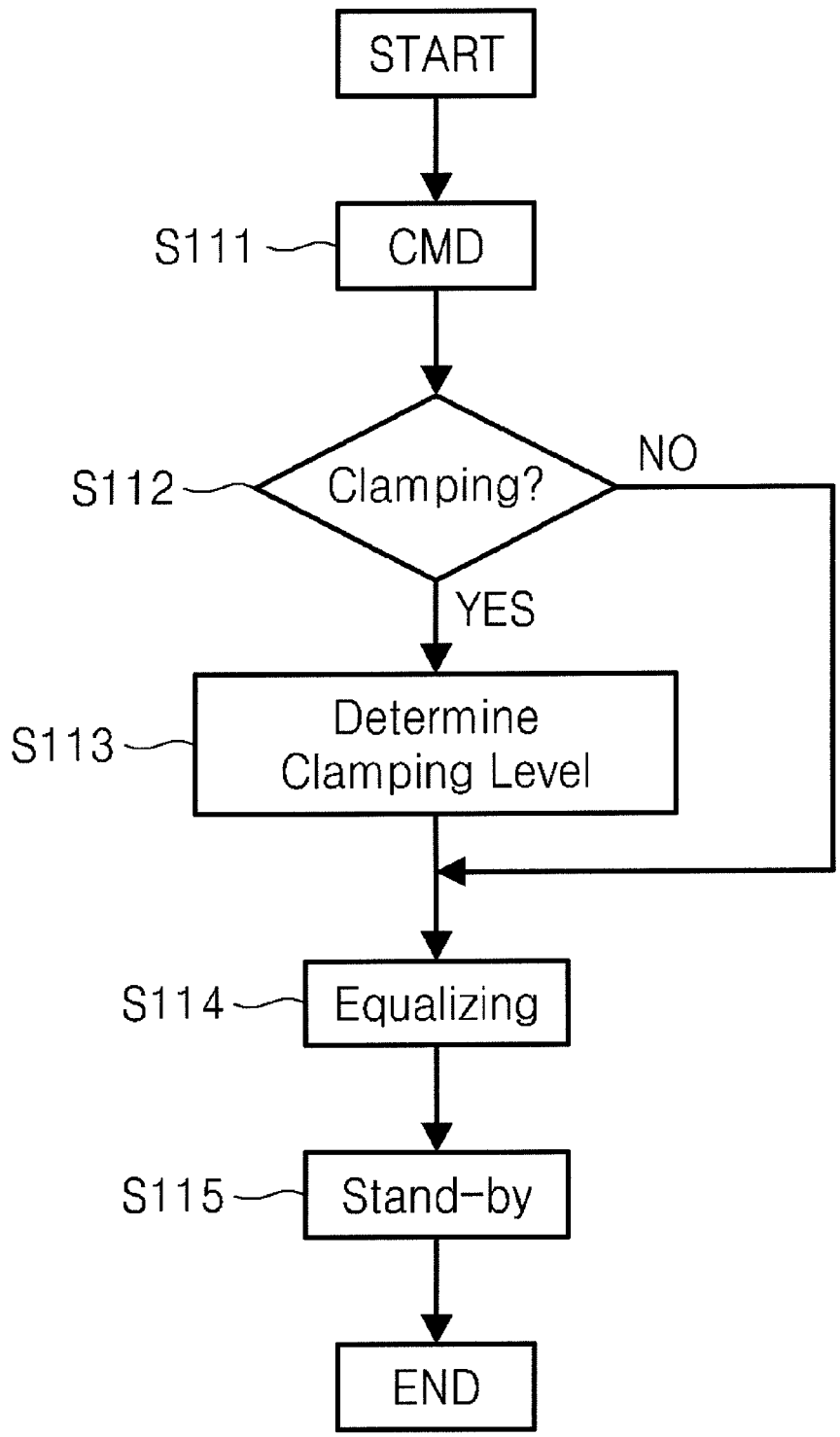
FIG. 11 is a flow chart illustrating a clamping operation of a semiconductor device according to an embodiment of the inventive concept.

FIG. 9a illustrates an exemplary embodiment of an equalizing operation between source line SL and bit line BL in a resistive memory device illustrated in FIG. 11.

Referring to FIG. 9a, the memory device 80 includes the memory cell array 81. The memory cell array includes a plurality of unit cells disposed in a matrix. Each unit cell Cell includes a resistive element and a switching element such as an NMOS transistor. The unit cell can be coupled to a source line SL, a bit line BL and a word line WL. The source line SL and the bit line BL are controlled by the source line decoder 84 and the bit line decoder 82, respectively.

The source line decoder 84 and the bit line decoder 821 may include an equalizer respectively comprising transfer gates TG1, TG2. When the source line decoder 84 and the bit line decoder 82 have an output according to a control signal (e.g., equalizing control signal), each output of the decoders may maintain a high impedance state. As transfer gates TG1, TG2 turns on, the source line SL and the bit line BL may be electrically connected and have the same voltage level for equalizing.

Figure 9B:
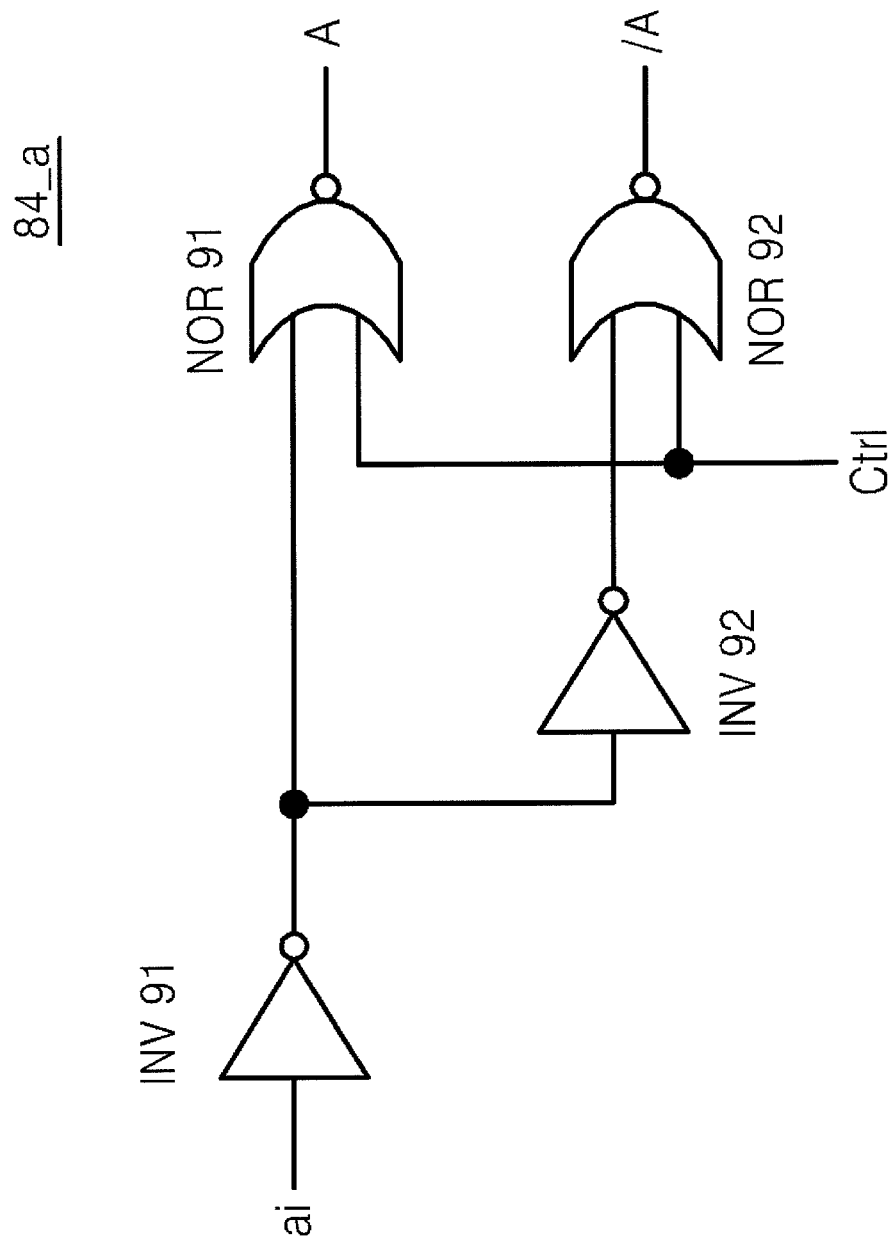
Figure 9C:
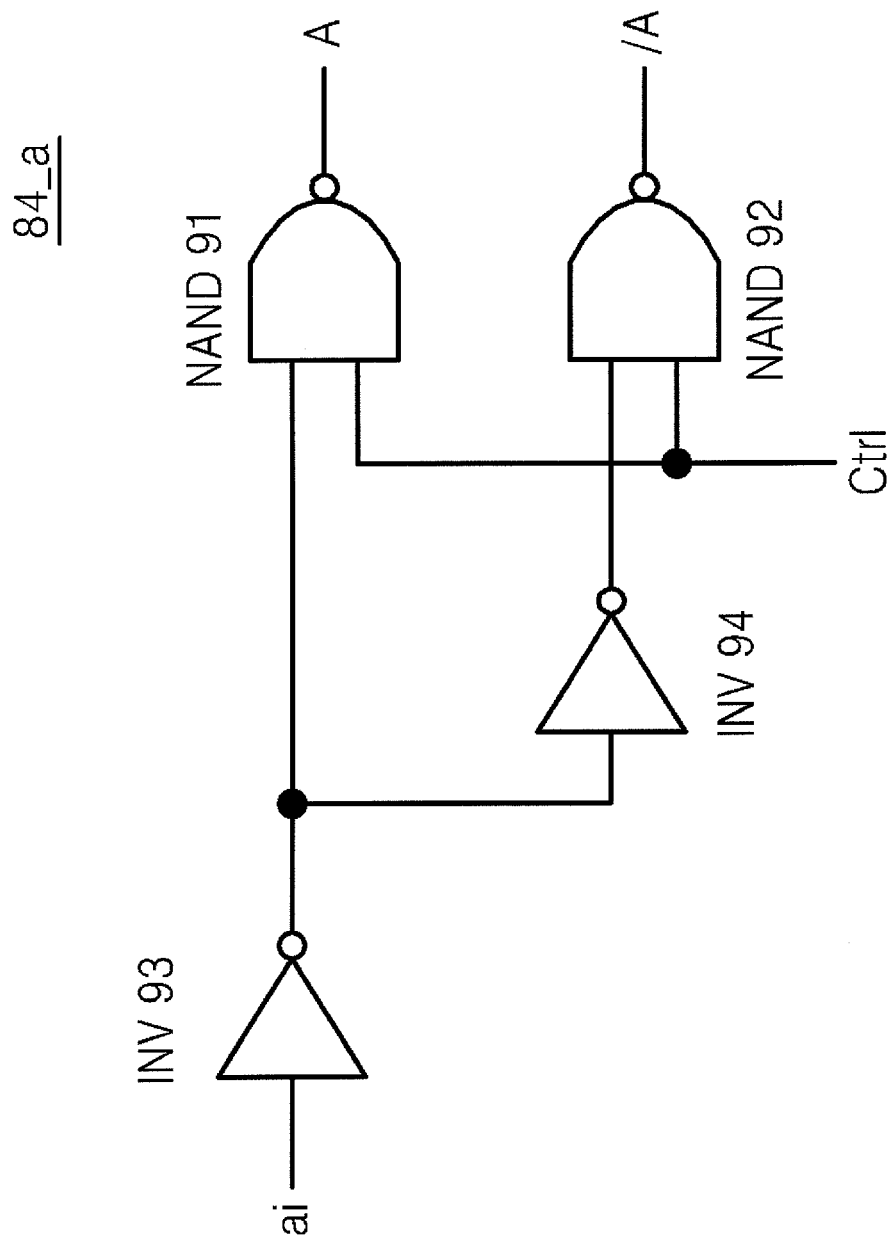

The source line decoder 84 and the bit line decoder 82 may include two parts. The first part may be a pre-decoder and the second part may be a main decoder. FIG. 9b and FIG. 9c respectively illustrate an exemplary embodiment of a pre-decoder in FIG. 9a.

Referring to FIG. 9b, the pre-decoder 84_a includes two inverters INV91, INV 92 and two NOR gates NOR 91, NOR 92. The inverter INV 91 inverts input signal ai. The inverter INV 92 inverts the output of the inverter INV 91. The NOR gate NOR 91 inputs the output of the inverter INV 91 and a control signal Ctrl. The NOR gate NOR 91 performs a NORing operation using the input signals and outputs a first signal A. The NOR gate NOR 92 inputs the output of the inverter INV 92 and a control signal Ctrl. The NOR gate NOR 92 performs the NORing operation using the input signals and outputs a second signal /A.

The control signal Ctrl may be a 'logic high' enable signal. A block mask signal blocking a certain block in a memory is an example of the control signal Ctrl. When the control signal Ctrl is in 'logic high', the first signal A and the second signal /A may have a same logic level. When the control signal Ctrl is in 'logic low', the first signal A and the second signal /A are have a different logic level.

Referring to FIG. 9c, the pre-decoder 84_a includes two inverters INV93, INV 94 and two NAND gates NAND 91, NAND 92. The inverter INV 93 inverts input signal ai. The inverter INV 94 inverts the output of the inverter INV 93. The NAND gate NAND 91 inputs the output of the inverter INV 93 and a control signal Ctrl. The NAND gate NAND 91 performs a NAND operation using the input signals and outputs the first signal A. The NAND gate NAND 92 inputs the output of the inverter INV 94 and a control signal Ctrl. The NAND gate NAND 92 performs the NAND operation using the input signals and outputs the second signal /A.

The control signal Ctrl may be a 'logic low' enable signal. The block mask signal blocking a certain block in a memory is an example of the control signal Ctrl. When the control signal Ctrl is in 'logic low', the first signal A and the second signal /A may have a same logic level. When the control signal Ctrl is in 'logic high', the first signal A and the second signal /A may have a different logic level.

As described in FIG. 9b and FIG. 9c, each embodiment has the control signals Ctrl that have a different controversial enabling logic level. The output signals A and /A may be the same in each embodiment.

Figure 9D:
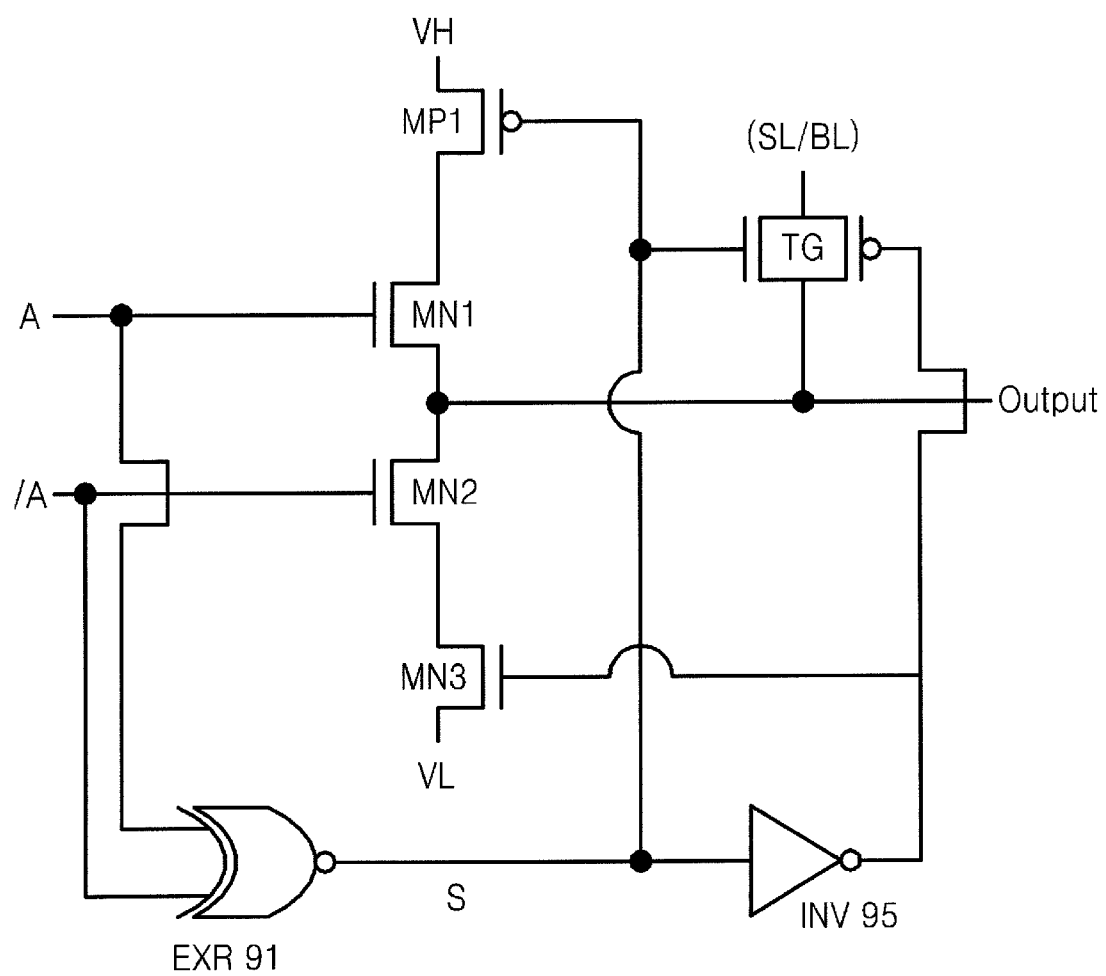

FIG. 9d illustrates an exemplary embodiment of a main decoder in FIG. 9a.

Referring to FIG. 9d, the main decoder 84_b includes a PMOS transistor MP1 and NMOS transistors MN1, MN2, MN4, an exclusive NOR gate EXR 91, an inverter INV95 and a transfer gate TG. The transistors MP1, MN1, MN2 and MN4 are serially connected between a first voltage supply VH and a second voltage supply VL. The exclusive NOR gate EXR 91 performs an exclusive NORing the first signal A and the second signal /A, and outputs switching control signal S. The inverter INV95 inverts a switching control signal S. The transfer gate TG is controlled by the switching control signal S and an inverted signal thereof.

Figure 9E:
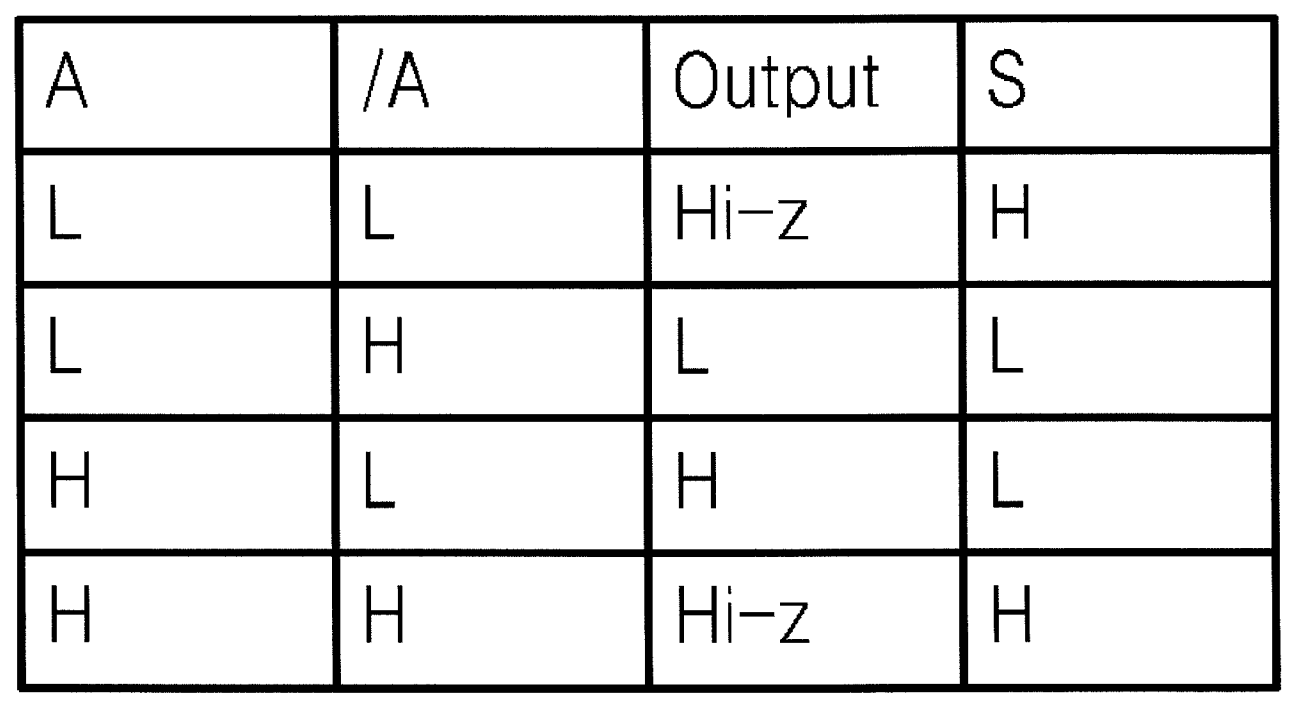

FIG. 9e is a table illustrating an operation of the decoder in FIG. 8 according to an embodiment of the inventive concept. Hereinafter, an operation of the exemplary embodiments of the inventive concept will be explained in detail with reference to FIG. 9b, FIG. 9d and FIG. 9e.

The first signal A and the second signal /A are outputted from the pre-decoder 84_a and inputted to the main decoder 84_b. When the control signal Ctrl is logic high, the first signal A and the second signal /A may have a same voltage level. The state of the first and second signal A, /A refers to whether the block or cell is enable or not (that is, a selected state or a standby state).

When the switching control signal S is a logic high level, the output may be in a high impedance (Hi-Z) state. The bit line, the source line and/or the word line may have a same voltage level through the equalizing path described in FIG. 8. The equalized same voltage level can be clamped by a clamper.

A 'logic low' state of the control signal refers to a situation that a cell or block is selected. When the control signal Ctrl is 'logic low', the first signal A and the second signal /A have a different logic level. The switching control signal S may maintain 'logic low'. The output terminal Output can have a logic level corresponding to the first signal A.

Figure 9F:
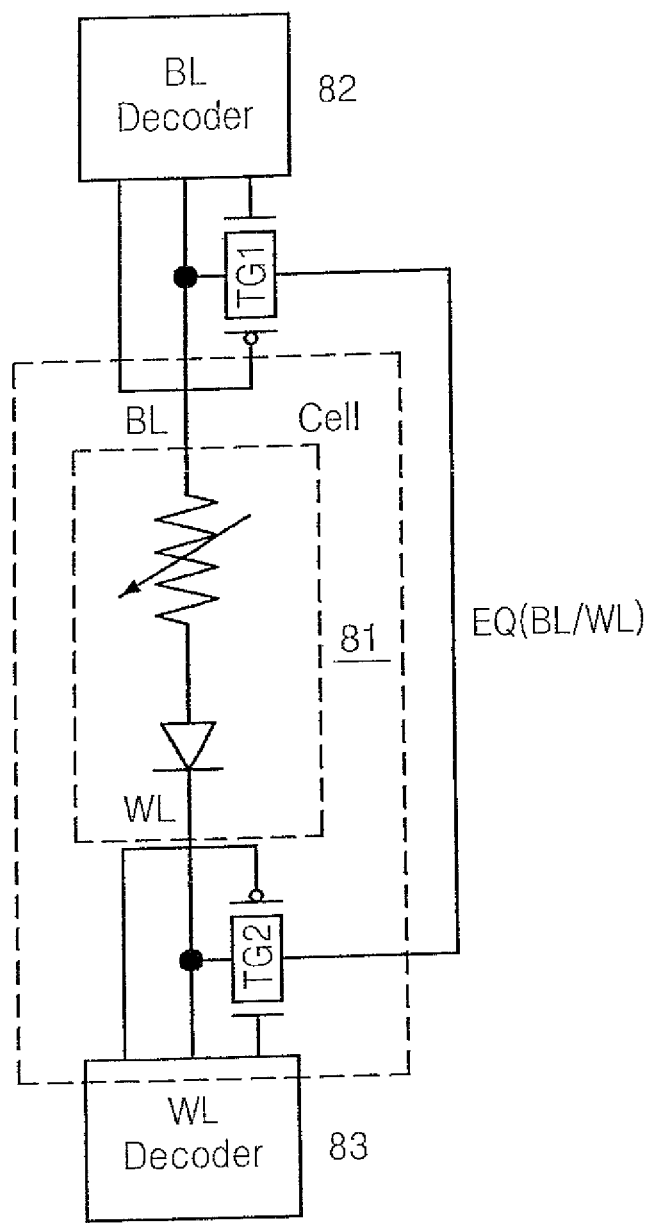

FIG. 9f illustrates an exemplary embodiment of an equalizing between bit line BL and word line WL in a resistive memory device illustrated in FIG. 8.

Referring to FIG. 9f, the memory device 80 includes a memory cell array 81, a bit line decoder 82 and a word line decoder 83. The memory cell array 81 includes a plurality of resistive unit cells. Each unit cell may include a resistive element and a diode. The Bit line BL and the word line WL are respectively controlled by the bit line decoder 82 and the word line decoder 83. The word line decoder 83 and the bit line decoder 82 may respectively include an equalizer comprising transfer gates TG2, TG1. When the word line decoder 83 or the bit line decoder 82 has an output such as an equalizing control signal corresponding to a control signal, outputs of the word line decoder 83 and bit line decoder 82 may maintain a 'high impedance' state. The word line WL and the bit line BL may be electrically connected and have a same voltage level when the transfer gate TG1, TG2 is on.

Referring to FIG. 10, when a cell or a block is in a standby state, the switching control signal S may be 'logic high'. When the cell or the block is in a read or write operation, the switching control signal S may be 'logic low'. When a cell or block is in non-selected or standby state, the switching control signal S may maintain 'logic high' (b). When the cell or the block is in a standby state, the source line SLi, the bit line BLi and/or the word line WLi may maintain a same voltage level for equalizing. When the cell or the block is in a read or write operation, the source line SLi, the bit line BLi and/or the word line WLi may have a voltage level corresponding to the operations described as 'T' (c).

The voltage level of equalizing may be changed according to operation characteristics of a system. When the cell or the block is unselected, the source line SLi, the bit line BLi and/or the word line may have a constant equalizing voltage level VEQ. The equalizing voltage level VEQ may be changed by the voltage level of the equalized signal lines. The equalizing voltage level VEQ may be changed by clamping.

FIG. 11 is a flow chart illustrating a clamping operation of a semiconductor device according to an embodiment of the inventive concept.

An equalizing voltage level may be optimized to a system by controlling an external voltage (e.g., external power supply). Referring to FIG. 11, a system may have an optimized clamping voltage level. A controller initiates an equalizing command S111. The command may refer to a mode register set (MRS) command including a clamping operation in an initialization state. The command may be initiated in an initialization state. The command may be initiated during a wake-up operation following a power-down state.

The semiconductor device may determine whether to perform a clamping operation or not during step S112. The clamping operation may be determined during an initialization of the semiconductor device. Whether to proceed the clamping operation or not may be determined in step S112 and then the most optimized condition of the clamping operation corresponding to the system may be detected S113. In some cases, the clamping operation may be performed during the wake-up operation from a sleep or power-down mode of the semiconductor device. When performing a clamping operation during the wake-up operation, the clamping voltage determined during the initialization may be reused.

After the clamping level is determined, the clamper may boost the voltage up to the clamping voltage level. An equalizing operation is performed (S114). In step S114, when clamping operation is determined not to be performed in step S112, the equalizing may be performed without the clamping operation while skipping the step S113. When the equalization is complete, the semiconductor device may be in a standby state (S115). The standby state may be a prior state of an operation to the semiconductor device wherein the operation is to be initiated by an external command.

Figure 12:
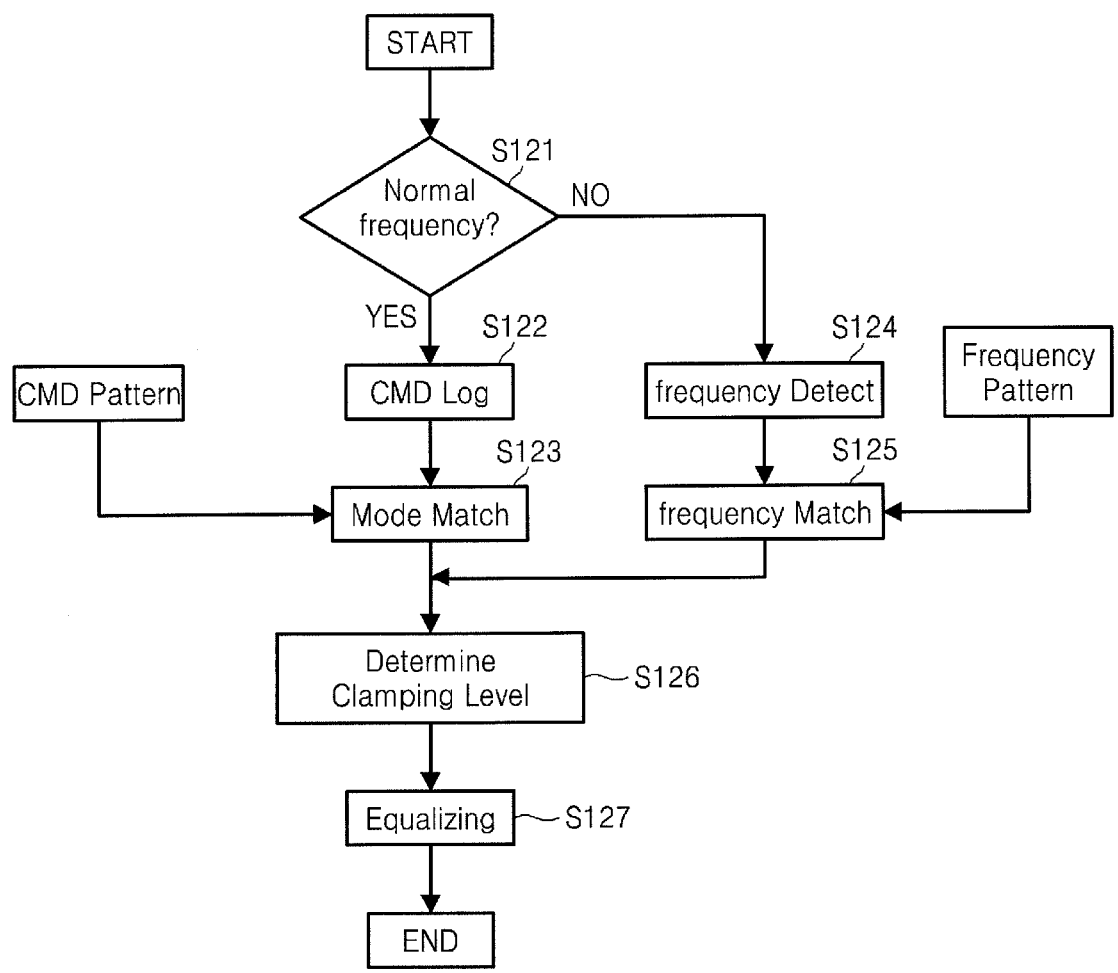
FIG. 12 is a flow chart illustrating a clamping operation of a semiconductor device according to an embodiment of the inventive concept.

FIG. 12 is a flow chart illustrating a clamping operation of a semiconductor device according to an embodiment of the inventive concept.

A resistive memory device may have a clamping voltage level according to a system applied or frequency (e.g. clock frequency) of the memory controller. A semiconductor device (e.g. a resistive memory device) may find a normal frequency of the system 5121. The normal frequency may refer to a fixed clock frequency.

When the clock frequency is normal, a command pattern dedicated to the system may be determined and an appropriate clamping voltage level according to the command pattern may be set. A command of the system is logged S122. In step S123, a mode match is performed. The mode match refers to a comparison of command patterns. That is, a command pattern stored in the resistive memory (or the system including the memory device) and a command pattern of the logged device are compared. In step 123, the clamping information about the system may be determined.

When the clock frequency is in abnormal, the memory device may detect the clock frequency of the system S124. In step S125, a frequency match is performed. The frequency match refers to a comparison of frequency patterns. That is, a frequency pattern stored in the resistive memory (or the system including the memory device) and a frequency pattern of the logged device are compared. In step S125, the clamping information about the system may be determined.

A clamping voltage level may be determined after finding the matched clamping information S126. The Equalization is performed to reach the clamping voltage level S127.

Figure 13:
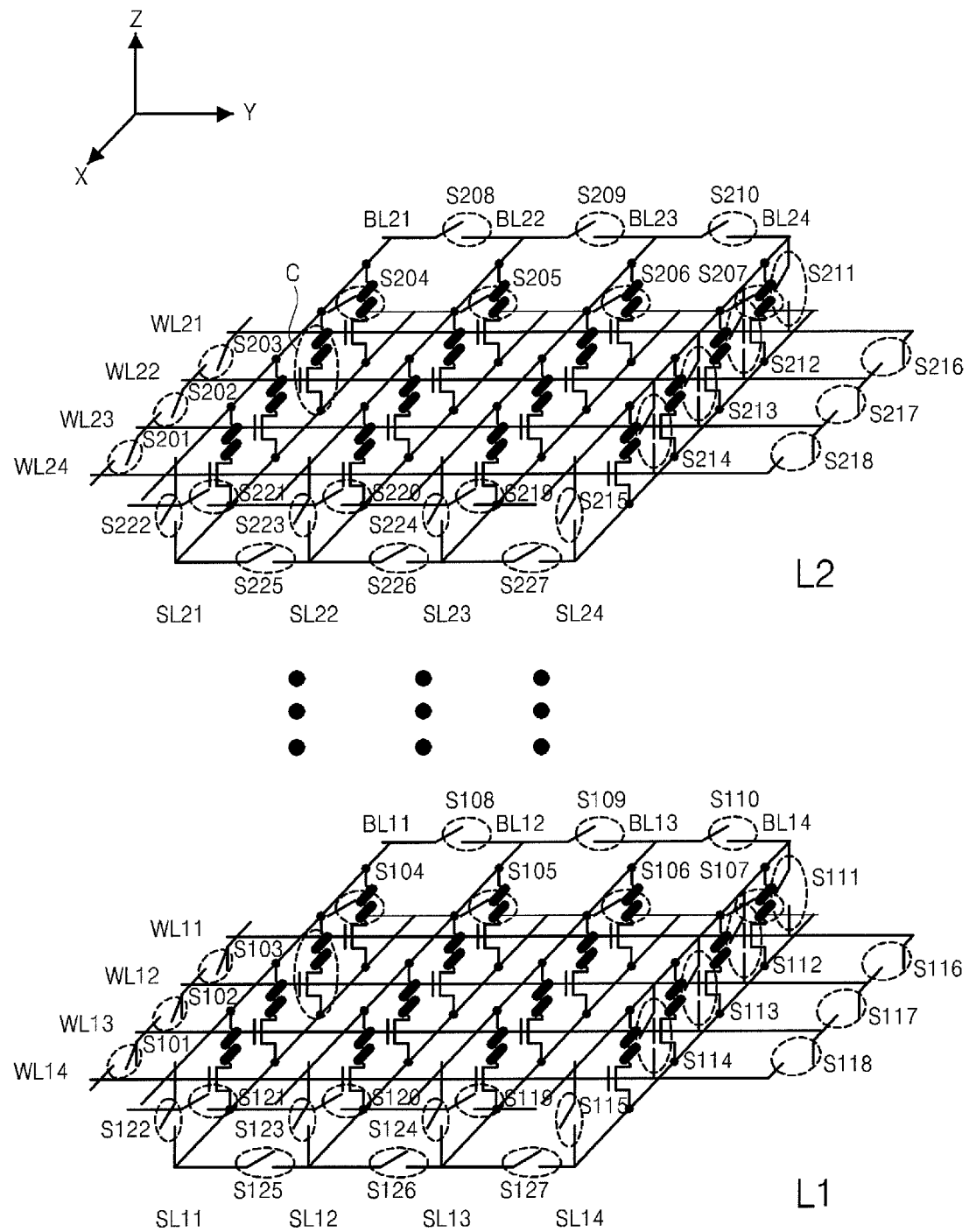
FIG. 13 is a circuit diagram illustrating a three-dimensional resistive memory device according to an embodiment of the inventive concept.

FIG. 13 is a circuit diagram illustrating a three-dimensional resistive memory device according to an embodiment of the inventive concept.

Referring to FIG. 13, the three-dimensional resistive memory device may include stacked layers L1, L2 according to an embodiment. Each layer L1, L2 may be formed by at least one from wafer stack, chip stack and cell stack. Each layer L1, L2 may be coupled by at least one from TSV (Through Silicon Via), wire bonding and bump. Each layer L1, L2 may include memory cell array arranged in a matrix at regular intervals by unit cell C including a three-terminal switching element (e.g. transistor) and a resistive element. Each unit cell C may commonly connected to data input/output lines BL11~BL24 and source lines SL11~SL24 in an X-direction and control lines WL11~WL24 in a Y-direction.

A plurality of switches S101~S227 are connected between unit cells C and/or lines (i.e. control lines, data input/output lines and source lines). The switches may constitute one or more equalizers. Some of the switches S101~S227 may be omitted in an embodiment. For instance, the switches S101, S102, S103, S111, S113, S114, S116, S117, S118, S201, S202, S203, S211, S212, S213, S214, S216, S217, S218 may be omitted in a resistive memory having two-terminal switching element. When the resistive memory has two-terminal switching element, control lines WL11~WL24 can be omitted.

The equalization between two layers L1, L2 may be controlled simultaneously. For instance, when each layer L1, L2 is located at different layers by wafer or chip stack, each layer L1, L2 may be controlled by respective equalizer located at the same layer or controlled by one equalizer located at a layer.

When the resistive memory device comprises cell stack, the switching element constituting the unit cell and the switch for the equalizer may be constituted by a resistive switch. The resistive switch may perform like a transistor since a current between source and drain is varied by an enforced gate voltage. The resistive switch may replace the transistor according to an embodiment. In an exemplary embodiment, the resistive switch can be Nano-bridge disclosed in the US Patent Application US20080079029 or in IEDM (International Electron Devices Meeting) 2005.

Figure 14:
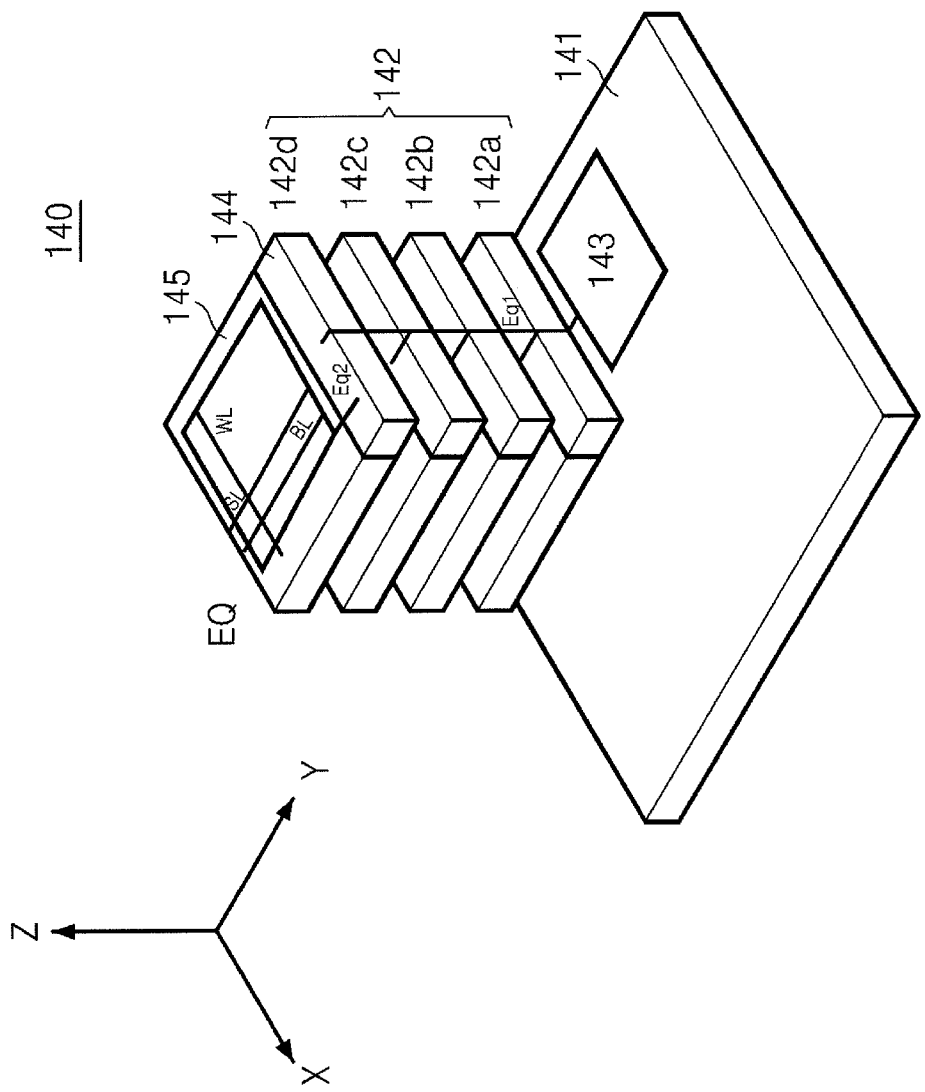
FIG. 14 is a schematic diagram illustrating a three-dimensional resistive memory device according to an embodiment of the inventive concept.

FIG. 14 is a schematic diagram illustrating a three-dimensional resistive memory device according to an embodiment of the inventive concept.

Referring to FIG. 14, the semiconductor memory device 140 includes interface layer 141 and multi-cell layer 142. The multi-cell layer 142 is stacked on the interface layer 141. The multi-cell layer may include stacked cell layers 142a~442d. Each cell layer 142a~142d may include a memory cell region 145 and a logic region 144.

The memory cell region 145 may include word lines WL and source lines SL arranged in an X-axis length direction and bit lines BL arranged in a Y-axis length direction. Each memory cell may be located at the cross point of each word line WL and bit line BL. Each memory cell constituting the memory cell region 145 may have unit cell structure described in previous embodiments.

The logic region 144 may include functional circuits. The functional circuits may be additional circuits supporting a memory device operation. The functional circuits may include at least one of an address decoder, a read/write control logic circuit, an output buffer and a compensation circuit. The address decoder may include a column decoder, a row decoder or a source line decoder.

The control region 143 may be located on the interface layer 141. The control region may control the respective logic regions 144 of the multi-cell layer 142. The control region 143 may include an interface unit for communicating with outside. The control region 143 may be electrically coupled to the logic region 144 through vertical connection lines. Each cell layer 142a~442d may include an equalizing path EQ. The equalizing path may be controlled by a second equalizing path Eq2 through the logic region 144. The equalizing path EQ may be controlled by a first equalizing path Eq1 through control region 143.

Figure 15:
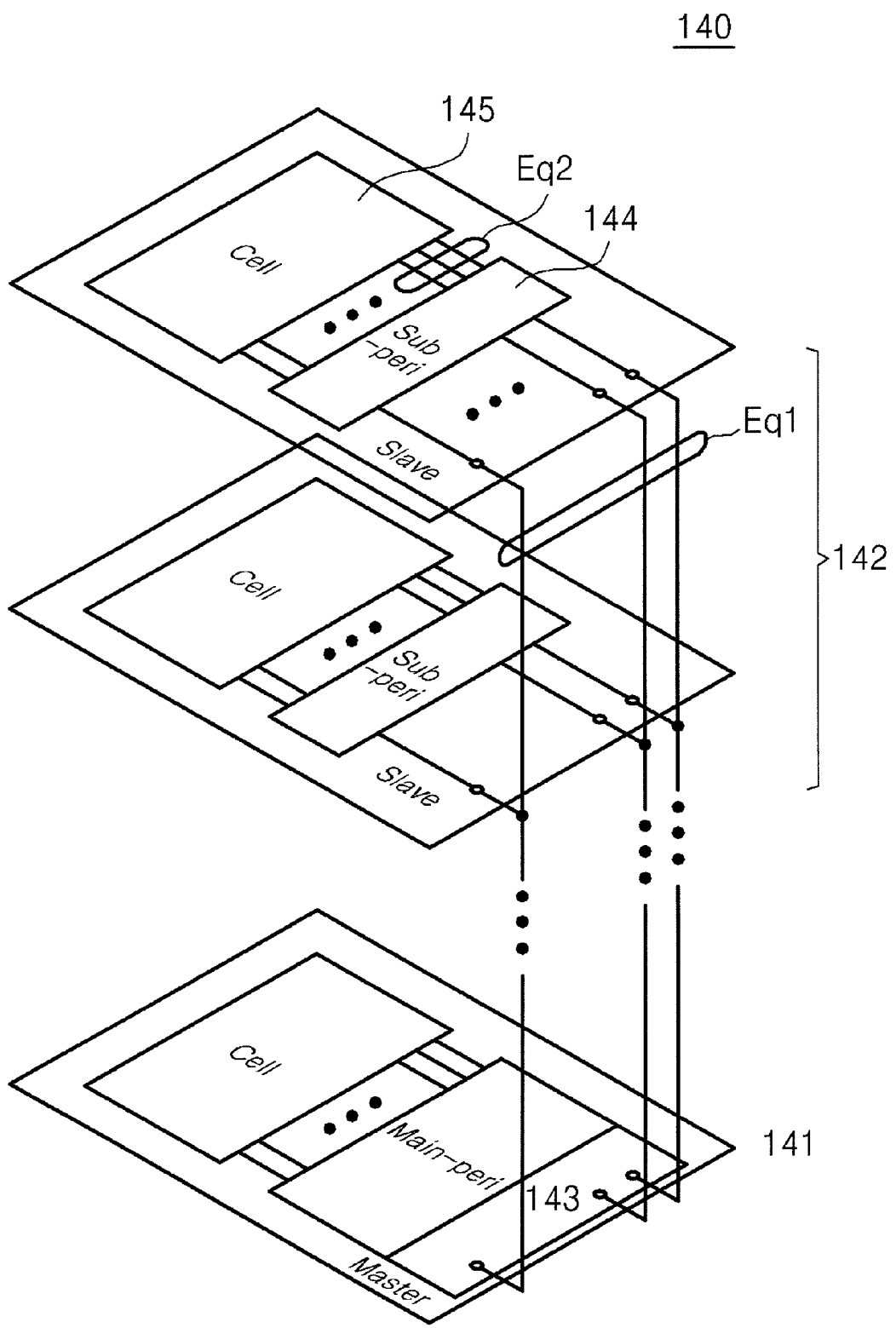
FIG. 15 is an exploded view illustrating a three-dimensional resistive memory device according to an embodiment of the inventive concept.

FIG. 15 is an exploded view illustrating a three-dimensional resistive memory device according to an embodiment of the inventive concept.

Referring to FIG. 15, the semiconductor memory device 140 includes interface layer 141 and multi-cell layer 142. The multi-cell layer 142 is stacked on the interface layer 141. The multi-cell layer 142 may include stacked cell layers. Each cell layer may include a memory cell region 145 and a logic region 144. The interface layer 141 may perform like a master and the multi-cell layer 142 may perform like a slave in communication system. The interface layer 143 may include a logic region 143 (e.g. main-peri). The multi-cell layer 142 may include a logic region 144 (e.g. sub-peri).

Figure 16:
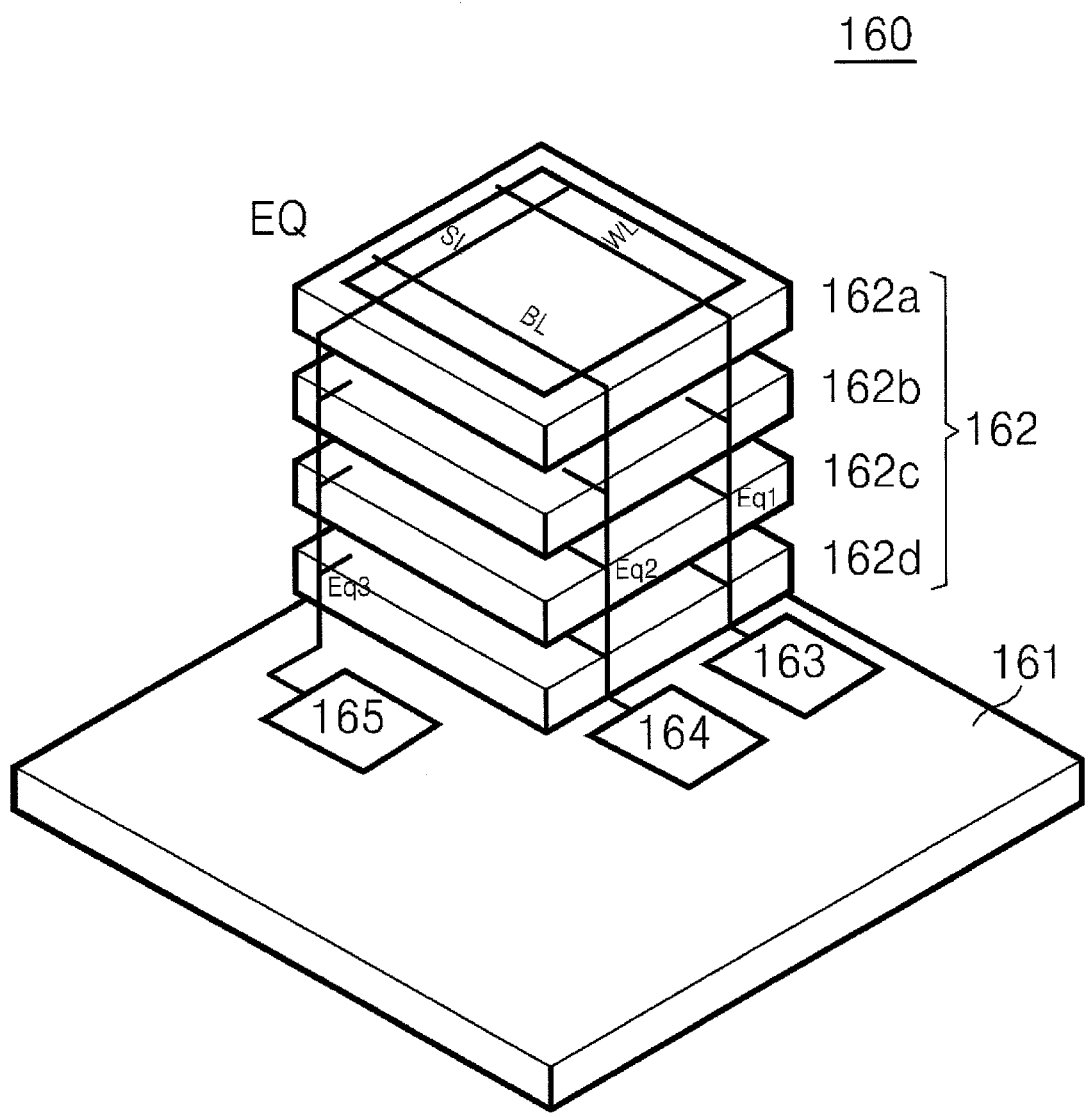
FIG. 16 is a schematic diagram illustrating a three-dimensional resistive memory device according to an embodiment of the inventive concept.

FIG. 16 is a schematic diagram illustrating a three-dimensional resistive memory device according to an embodiment of the inventive concept.

Referring to FIG. 16, the semiconductor memory device 160 includes an interface layer 161 and a multi-cell layer 162 stacked on the interface layer 161. The multi-cell layer 162 includes stacked cell layers 162a~162d. Each cell layer 162a~162d includes a memory cell region. Each cell layer 162a~162d includes a memory cell region.

The interface layer 161 may include elements for controlling an equalization of the inventive concept. The interface layer 161 may include a source line decoder 165, a bit line decoder 164 and a word line decoder 163. The source line decoder 165 controls a source line SL and an equalizing path Eq3. The bit line decoder 164 controls a bit line BL and an equalizing path Eq2. The word line decoder 163 controls a word line WL and an equalizing path Eq1.

When each decoder 163, 164, 165 performs like a driver, that is each decoder 163, 164, 165 may respectively control the equalizing paths Eq1, Eq2, Eq3 such that a decoding function may be constituted by other functional blocks in the interface layer 161. The interface layer 161 may include the memory cell region.

Figure 17:
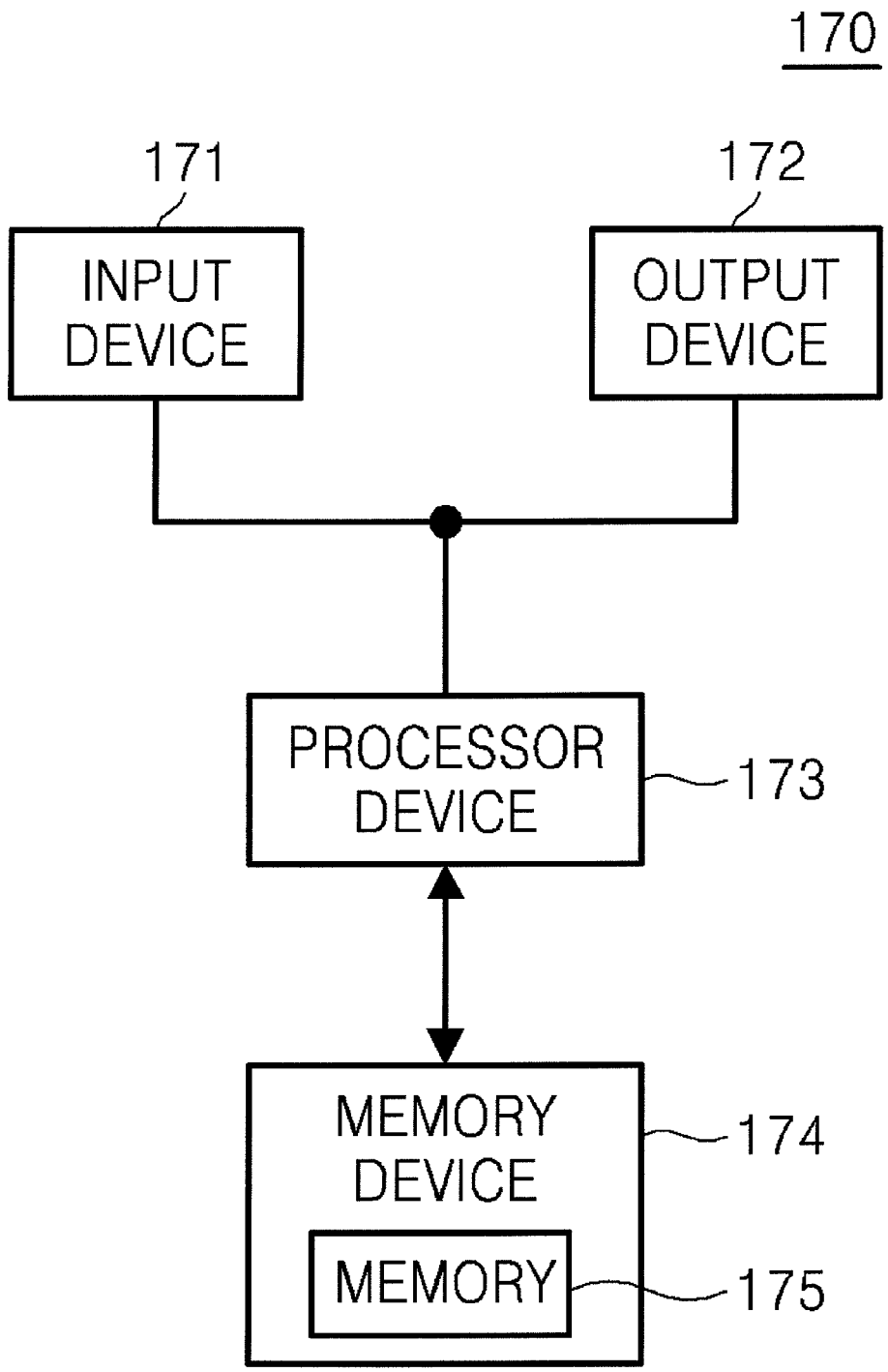
FIG. 17 is a block diagram illustrating an electronic system including a three-dimensional semiconductor memory device according to an embodiment of the inventive concept.

FIG. 17 is a block diagram illustrating an electronic system including a three-dimensional semiconductor memory device formed according to an application embodiment of the inventive concept.

Referring to FIG. 17, the electronic system 170 may include at least one of the semiconductor device or the semiconductor package according to the embodiments of the inventive concept. The electronic system may include a mobile device, a computer or the like. For instance, the electronic system may include a memory device 174, a processor device 173, an input device 171, and an output device 172.

Herein, above-described functional blocks may perform data communication by using an internal bus. The processor device 173 may run a program and control the electronic system 170. The memory device 174 may include a memory 175 according to embodiments of the inventive concept. The memory device 174 may be used for an operating memory of the processor device 173. The memory 175 may include one layer structure or a three-dimensionally stacked structure with an interface chip and/or a memory controller.

Figure 18:
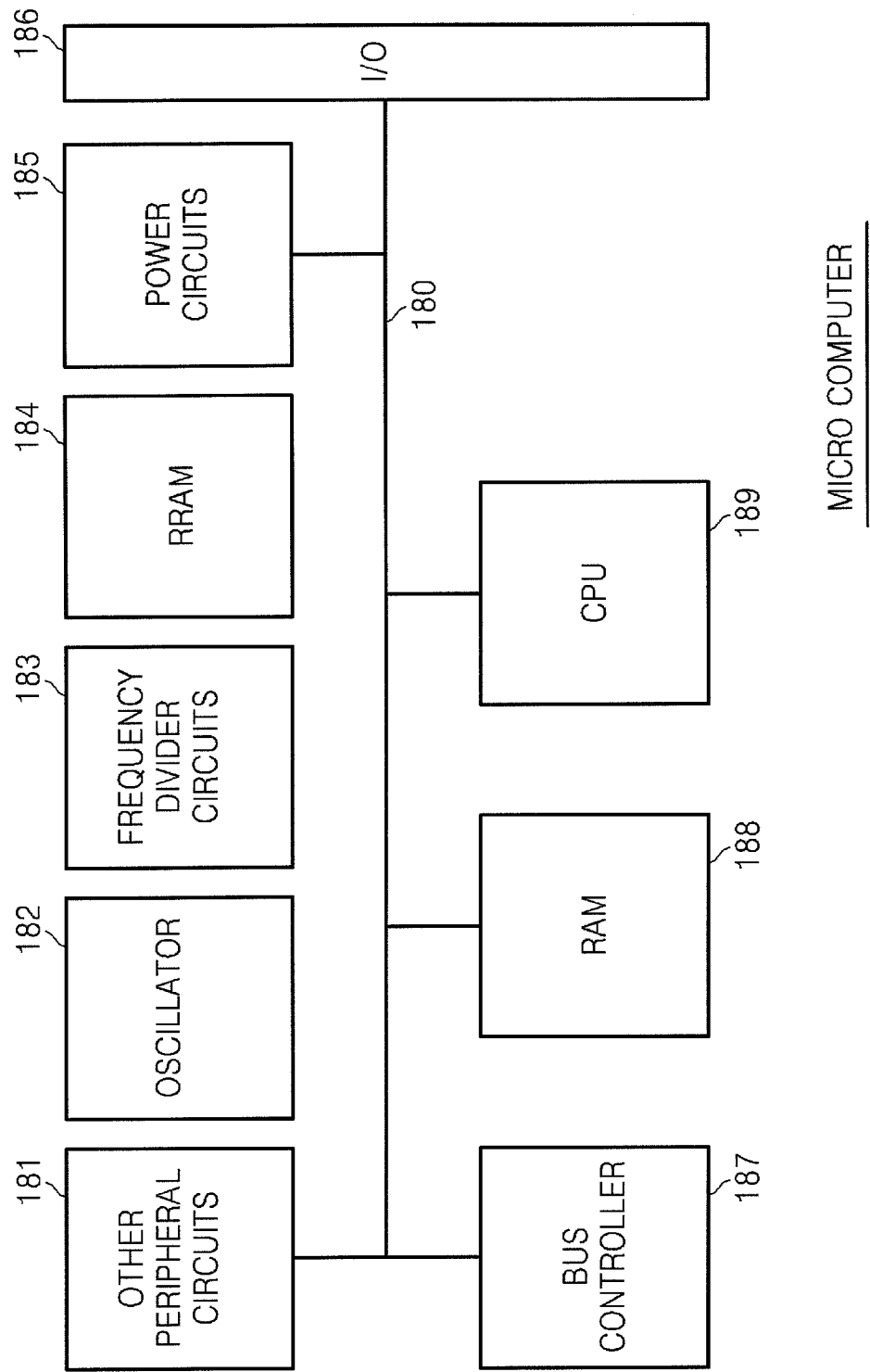
FIG. 18 is a block diagram illustrating a single chip microcomputer including a three-dimensional semiconductor memory device according to an embodiment of the inventive concept.

FIG. 18 is a block diagram illustrating a single chip microcomputer including a three-dimensional semiconductor memory device according to an embodiment of the inventive concept.

Referring to FIG. 18, the micro-computer can be formed over one semiconductor substrate (i.e. chip) like single crystal silicon by, for example, a semiconductor integrated circuit fabrication technique. A micro-computer includes, as a circuit module connected to an internal bus 180, a central processing unit (CPU) 189, a random access memory (RAM) 188 used for work area of the CPU 189, a bus controller 187, an oscillator 182, a frequency divider circuit 183, a resistive random access memory (RRAM) 184, a power circuit 185, an input/output port (I/O) 186, and other peripheral circuits 181 such as a time counter.

The CPU 189 may include a command control part (not shown) and an execution part (not shown). The CPU 189 decodes a fetched command and performs operation by the execution part according to the decode result. The RRAM 184 may store an operation program or data of the CPU 189. The power circuit 185 generates high voltage for erase and write of the RRAM 184. The frequency divider circuit 183 frequency-divides source oscillation of the oscillator 182 to generate an operation reference clock signal and other internal clock signals. The internal bus 180 may include an address bus, a data bus and a control bus. The bus controller 187 responds to an access request from the CPU 189 to perform bus access control of the access cycle, the number of wait states and the bus width according to its accessed address.

When the micro-computer is mounted over the system, the CPU 189 performs erase and write control to the RRAM 188. In the device test or fabrication stage, an external write device can directly perform erase and write control to the RRAM 188 via the input/output port 186. The RAM 188 may include RRAM described through embodiments of the inventive concept.

Figure 19:
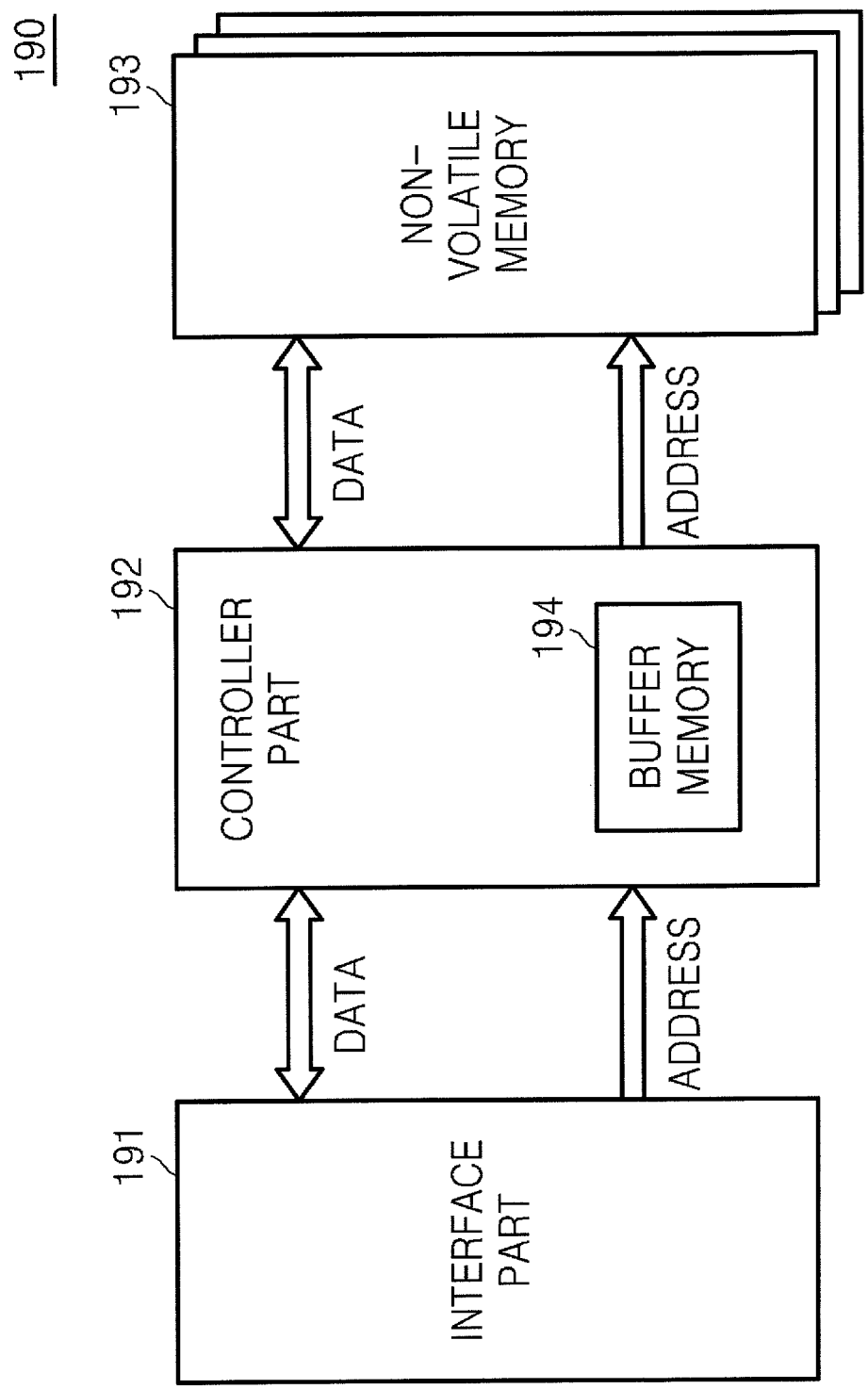
FIG. 19 is a block diagram illustrating memory card including a semiconductor memory device according to an embodiment of the inventive concept.

FIG. 19 and FIG. 20 are block diagrams respectively illustrating a memory card including a semiconductor memory device according to an embodiment of the inventive concept.

Referring to FIG. 19 and FIG. 20, each memory card 190, 200 includes an interface part 191, 201 performing interface with outside, a controller (CONTROLLER PART) 192, 202 including a buffer memory (BUFFER MEMORY) 194, 204 performing operation control of the memory card 190, 200, and one or more non-volatile memories 193, 203. Non-volatile memories 193, 203 may include RRAM including an equalizing function according to an embodiment of an inventive concept. The controller 192, 202 couples to the interface part 191, 201 by a data bus (DATA) and an address bus (ADDRESS), and couples to the non-volatile memories 193, 203 through the data bus (DATA) and the address bus (ADDRESS).

When the memory card 190, 200 includes an address translation table (ADDRESS TRANSLATION TABLE) 205 of an address logic table (LOGICAL ADDRESS) inputted from outside and an address (PHYSICAL ADDRESS) accessed in the non-volatile memory in FIG. 20. New data may be written into an arbitrary physical address (PHYSICAL ADDRESS) to update the address translation table 205 during a write operation. The memory card 200 including the address translation table 205 may select a physical address to provide a new memory array including the physical address performing a read operation. According to embodiments of the present invention, leakage current issue and operational error may be reduced by equalizing or equalizing and clamping at least source line and data input/output line to have a same voltage level on the cell in standby or unselected state in a resistive memory device including a switching element. And, stand-by current may be reduced.

Although the exemplary embodiments of the present invention have been described herein with reference to the accompanying drawings, it is to be understood that the present invention should not be limited to those precise embodiments and that various other changes and modifications may be affected therein by one of ordinary skill in the related art without departing from the scope or spirit of the invention. All such changes and modifications are intended to be included within the scope of the invention as defined by the appended claims.

What is claimed is:

1. A resistive memory device, comprising:
a bit line decoder coupled to a bit line;
a word line decoder coupled to a word line;
a memory cell including a resistive element coupled to the bit line for storing data and a diode coupled to the word line; and
a respective equalizer coupled between the bit line and the bit line decoder and between the word line and the word line decoder and configured to selectively connect the bit line and the word line at a same voltage level.

2. A resistive memory device, comprising:
a memory cell including a resistive element for storing data and a switching element, the switching element including at least three terminals, a first terminal of the three terminals is coupled to the resistive element;
a control line coupled to a second terminal of the three terminals to control the switching element;
a data input/output line coupled to the resistive element to read data from the resistive element or write data to the resistive element;
a source line coupled to a third terminal of the three terminals; and an equalizer configured to selectively connect the data input/output line and the source line, wherein the equalizer is configured to selectively connect the data input/output line, the source line and the control line to have a substantially same voltage level when the memory cell is in inactive state.

3. The resistive memory device of claim 2, further comprises at least one of a first sub-equalizer configured to selectively connect the data input/output line and the control line and a second sub-equalizer configured to selectively connect the source line and the control line.

4. A three-dimensional resistive memory device, comprising:
   a multi-stack layer including a plurality of stacked layers, at least one of the stacked layers comprising:
   a bit line decoder coupled to a bit line;
   a word line decoder coupled to a word line;
   a memory cell including a resistive element coupled to the bit line for storing data and a diode coupled to the word line; and
   a respective equalizer coupled between the bit line and the bit line decoder and between the word line and the word line decoder and configured to selectively connect the bit line and the word line at a same voltage level.

5. A three-dimensional resistive memory device, comprising:
   a multi-stack layer including a plurality of stacked layers, at least one of the stacked layers comprising:
   a memory cell including a resistive element and a switching element, the switching element including at least three terminals,
   a first terminal of the three terminals is coupled to the resistive element,
   a control line coupled to a second terminal of the three terminals to control the switching element,
   a data input/output line coupled to the resistive element to read data from the resistive element or write data to the resistive element, and
   a source line coupled to a third terminal of the three terminals, and
   an equalizer configured to selectively connect the data input/output line and the source line,
   wherein the equalizer connects the data input/output line, the source line and the control line to have a substantially same voltage level when the memory cell is in inactive state.

6. The three-dimensional resistive memory device of claim 5, further comprising at least one of a first sub-equalizer configured to selectively connect the data input/output line and the control line and a second sub-equalizer configured to selectively connect the source line and the control line.

* * * * *